United States Patent
Nassar et al.

(10) Patent No.: US 9,112,346 B2
(45) Date of Patent: Aug. 18, 2015

(54) INPUT POWER PROTECTION

(71) Applicant: Fairchild Semiconductor Corporation, San Jose, CA (US)

(72) Inventors: Christopher Nassar, Portland, ME (US); William Newberry, Standish, ME (US); Adrian Mikolajczak, Los Altos, CA (US); Jaime Bravo, Old Orchard Beach, ME (US)

(73) Assignee: Fairchild Semiconductor Corporation, San Jose, CA (US)

( * ) Notice: Subject to any disclaimer, the term of this patent is extended or adjusted under 35 U.S.C. 154(b) by 195 days.

(21) Appl. No.: 13/830,964

(22) Filed: Mar. 14, 2013

(65) Prior Publication Data

US 2014/0268443 A1    Sep. 18, 2014

(51) Int. Cl.
*H02H 9/02*    (2006.01)
*H02H 9/04*    (2006.01)

(52) U.S. Cl.
CPC .. *H02H 9/02* (2013.01); *H02H 9/04* (2013.01)

(58) Field of Classification Search
CPC .................................. H02H 9/02; H02H 9/04
USPC ......................................................... 361/104
See application file for complete search history.

(56) References Cited

U.S. PATENT DOCUMENTS

| | | | |
|---|---|---|---|
| 3,370,219 A | 2/1968 | Hupp | |
| 3,702,418 A | 11/1972 | Obenhaus | |
| 4,061,962 A | 12/1977 | Stewart | |
| 4,163,186 A | 7/1979 | Haley | |
| 4,533,970 A | 8/1985 | Brown | |
| 4,652,964 A | 3/1987 | Ziegenbein | |
| 4,759,362 A | 7/1988 | Taniguchi | |
| 4,975,798 A | 12/1990 | Edwards et al. | |
| 5,164,874 A | 11/1992 | Okano et al. | |
| 5,379,176 A * | 1/1995 | Bacon et al. | 361/106 |
| 5,539,299 A | 7/1996 | Fernandez et al. | |
| 5,748,422 A | 5/1998 | Heaston et al. | |
| 5,763,929 A | 6/1998 | Iwata | |
| 5,973,977 A | 10/1999 | Boyd et al. | |
| 6,114,672 A | 9/2000 | Iwasaki et al. | |
| 6,320,275 B1 | 11/2001 | Okamoto et al. | |
| 6,331,763 B1 * | 12/2001 | Thomas et al. | 320/136 |
| 6,489,879 B1 | 12/2002 | Singh et al. | |

(Continued)

FOREIGN PATENT DOCUMENTS

DE    2917256 C2    11/1980
DE    10146947 A1    4/2003

OTHER PUBLICATIONS

"Tips for Enhancing ESD Protection", Littlefuse Indistries, Application Note, 2009, 4 pages.

(Continued)

*Primary Examiner* — Thienvu Tran
*Assistant Examiner* — Kevin J Comber
(74) *Attorney, Agent, or Firm* — Brake Hughes Bellermann LLP

(57) ABSTRACT

In one general aspect, an apparatus can include an input terminal, an output terminal and a ground terminal. The apparatus can also include an overcurrent protection device coupled between the input terminal and the output terminal. The apparatus can further include a thermal shunt device coupled between the output terminal and the ground terminal, the thermal shunt device being configured to, at a threshold temperature, operate in a thermally-induced low-impedance state.

24 Claims, 15 Drawing Sheets

(56) References Cited

U.S. PATENT DOCUMENTS

| | | |
|---|---|---|
| 6,492,792 B1 | 12/2002 | Johnson, Jr. et al. |
| 6,521,483 B1 | 2/2003 | Hashimoto |
| 6,700,766 B2 | 3/2004 | Sato |
| 6,937,454 B2 | 8/2005 | Mikolajczak et al. |
| 7,031,130 B2 | 4/2006 | Simonelli et al. |
| 7,106,572 B1 | 9/2006 | Girard |
| 7,660,096 B2 * | 2/2010 | Golubovic et al. ........... 361/124 |
| 8,031,449 B2 | 10/2011 | Burns et al. |
| 2002/0024791 A1 | 2/2002 | Whitney et al. |
| 2002/0071233 A1 | 6/2002 | Bock et al. |
| 2005/0141161 A1 * | 6/2005 | Usui ........................... 361/93.1 |
| 2005/0225421 A1 | 10/2005 | Furuta |
| 2005/0258805 A1 | 11/2005 | Thomas et al. |
| 2005/0275065 A1 | 12/2005 | Cogan et al. |
| 2006/0215342 A1 | 9/2006 | Montoya et al. |
| 2008/0130180 A1 | 6/2008 | De Palma et al. |
| 2009/0212937 A1 | 8/2009 | Stamer et al. |
| 2012/0127619 A1 * | 5/2012 | Mikolajczak ................... 361/79 |
| 2012/0200967 A1 | 8/2012 | Mikolajczak |

OTHER PUBLICATIONS

"An Investigation into the Physics of Blowing Polysilicon Fuses", Report for 62nd European Study Group with Industry, Limerick, 2008, pp. 1-13.

NXP Semiconductors, "AN10910: Protecting charger interfaces and typical battery charging topologies with external bypass transistors", Application note, Rev. 01, Apr. 28, 2010, 17 pages.

\* cited by examiner

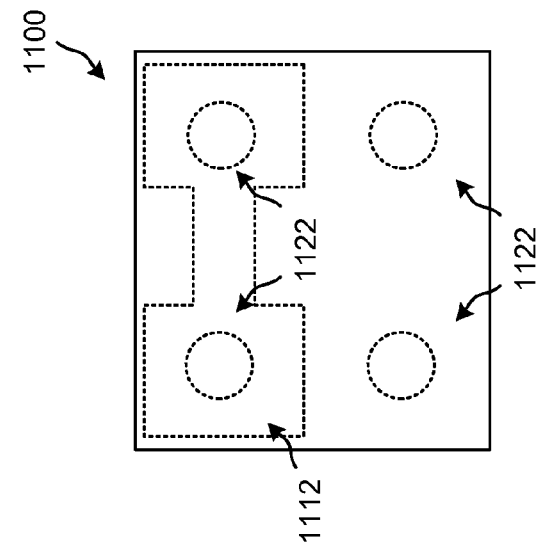
FIG. 11A
FIG. 11B
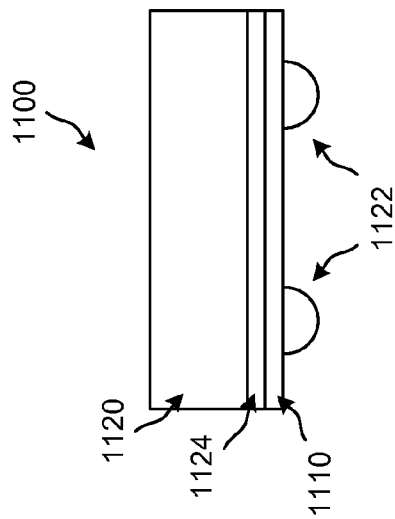
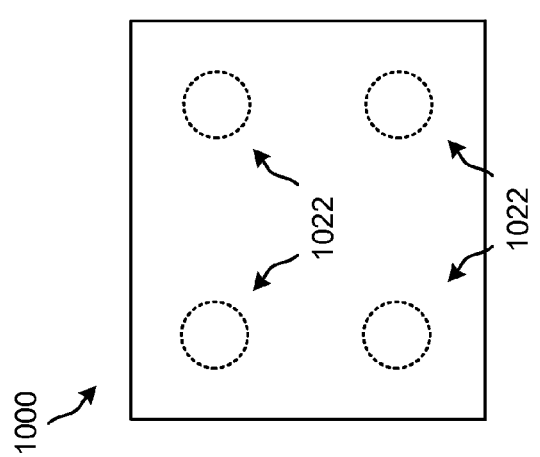
FIG. 10A
FIG. 10B
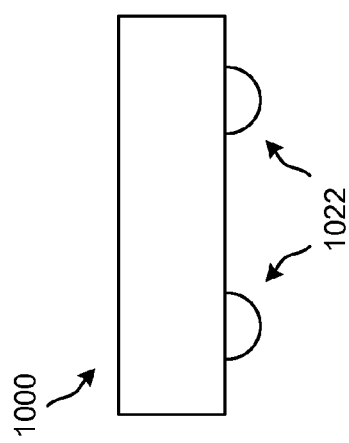

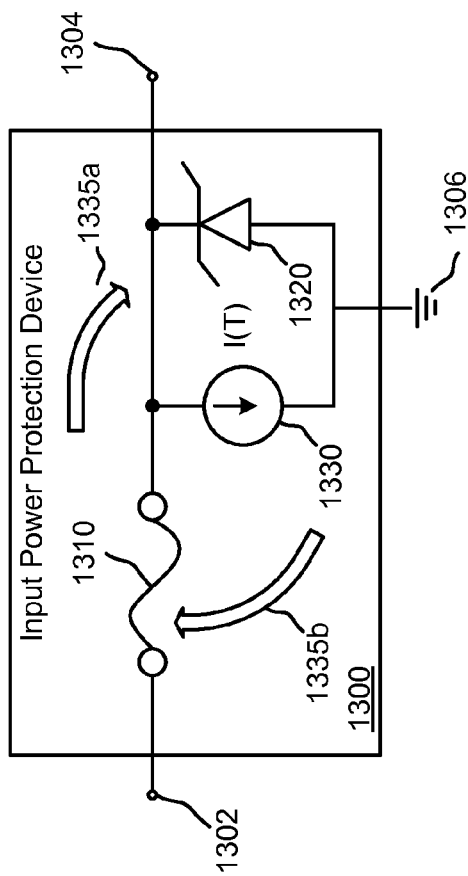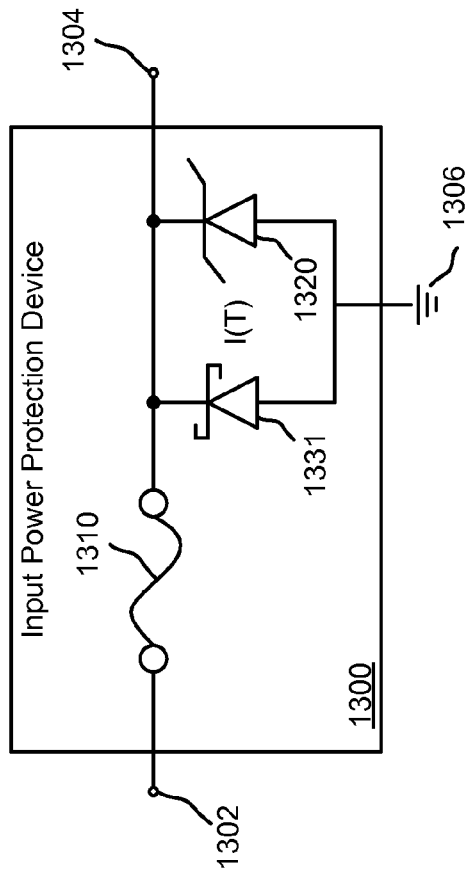
FIG. 13A
FIG. 13B

INPUT POWER PROTECTION

TECHNICAL FIELD

This description relates to input power port protection circuits and components.

BACKGROUND

Input power ports and/or related components can be protected from undesirable power conditions (e.g., over-temperature conditions, overcurrent conditions and/or overvoltage conditions) using multiple discrete devices such as fuses, thermal crowbars and/or Zener diodes. When an input power port is protected from undesirable power conditions using multiple discrete devices, unpredictable and/or unwanted interactions can occur between the discrete devices. For example, certain discrete devices selected for overvoltage protection of the input power port may not interact in a favorable fashion with other discrete devices selected for overcurrent protection of the input power port. Unmatched components can result in various irregular failure modes and/or damage to downstream components intended for protection at the input power port, including, but not limited to, printed circuit board fires. Also, the complexity and cost of assembly of protection at an input power port may be increased in an unfavorable manner when multiple discrete components are used in conventional circuits used for input power port protection. Thus, a need exists for systems, methods, and apparatus to address the shortfalls of present technology and to provide other new and innovative features.

SUMMARY

In one general aspect, an apparatus can include an input terminal, an output terminal and a ground terminal. The apparatus can also include an overcurrent protection device coupled between the input terminal and the output terminal. The apparatus can further include a thermal shunt device coupled between the output terminal and the ground terminal, the thermal shunt device being configured to, at a threshold temperature, operate in a thermally-induced low-impedance state.

In another general aspect, an apparatus can include an input terminal, an output terminal and a ground terminal. The apparatus can also include an overvoltage protection device coupled between the output terminal and the ground terminal. The apparatus can further include a thermally-activated current sink coupled between the output terminal and the ground terminal, in parallel with the overvoltage protection device. The apparatus can yet further include an overcurrent protection device coupled between the input terminal and the output terminal, the overcurrent protection device being thermally coupled with the overvoltage protection device and the thermally-activated current sink such that heat produced by the overcurrent protection device at a current below a rated current of the overcurrent protection device causes at least one of the overvoltage protection device and the thermally-activated current sink to change from a high impedance state to a low impedance state.

In yet another general aspect, an apparatus can include an overvoltage protection portion, the overvoltage protection portion including a thermally-activated current sink. The apparatus may also include an overcurrent protection portion operably coupled to the overvoltage protection portion such that the overvoltage protection portion changing from a voltage regulation state to a thermally-induced conduction state causes the overcurrent protection portion to change from a current conduction state to a current blocking state.

The details of one or more implementations are set forth in the accompanying drawings and the description below. Other features will be apparent from the description and drawings, and from the claims.

BRIEF DESCRIPTION OF THE DRAWINGS

FIG. 10A is a side view of an input power protection device, according to an embodiment.

FIG. 10B is a top view of the input power protection device shown in FIG. 10A, according to an embodiment.

FIG. 11A is a side view of another input power protection device, according to an embodiment.

FIG. 11B is a top view of the input power protection device shown in FIG. 11A, according to an embodiment.

FIGS. 13A and 13B are schematics that illustrate additional input power protection devices, according to example embodiments.

DETAILED DESCRIPTION

Figure 1:
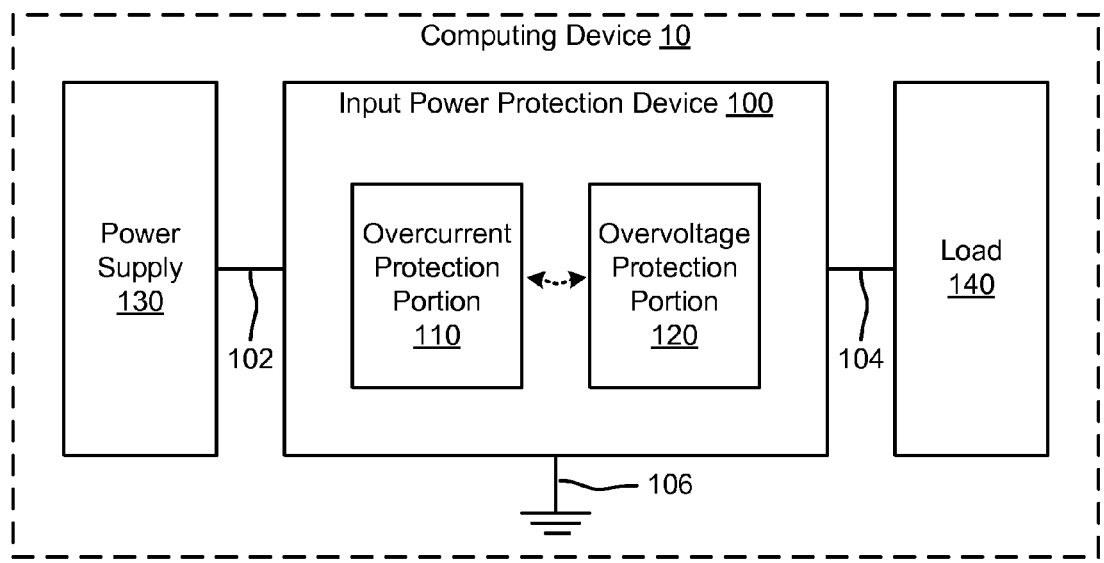
FIG. 1 is a block diagram that illustrates an input power protection device.

FIG. 1 is a block diagram that illustrates an input power protection device 100. As shown in FIG. 1, the input power protection device 100 includes an overcurrent protection portion 110 and an overvoltage protection portion 120. In some embodiments, the overcurrent protection portion 110 and the overvoltage protection portion 120 can collectively be referred to as components of the input power protection device 100.

The input power protection device 100 is configured to provide power protection to a load 140 from one or more undesirable power conditions. In some embodiments, the undesirable power conditions (which can include an overvoltage condition and/or an overcurrent condition) such as a voltage spike (related to power supply noise) and/or a current spike (caused by a downstream overcurrent event such as a short) may be produced by the power supply 130. For example, the load 140 may include electronic components (e.g., sensors, transistors, microprocessors, application-specific integrated circuits (ASICs), discrete components, circuit board) that could be damaged in an undesirable fashion by relatively fast increases in current and/or voltage produced by the power supply 130. Accordingly, the input power protection device 100 can be configured to detect and prevent these relatively fast increases in current and/or voltage from damaging the load 140 and/or other components associated with the load 140 (such as a circuit board).

In some embodiments, the overcurrent protection portion 110 and the overvoltage protection portion 120 can be included in the input power protection device 100 so that the overcurrent protection portion 110 provides series overcurrent protection and the overvoltage protection portion 120 provides shunt to ground overvoltage protection. The series overcurrent protection provided by the overcurrent protection portion 110 and the shunt to ground overvoltage protection provided by the overvoltage protection portion 120 can be integrated into a single package of the input power protection device 100 so that the input power protection device 100 is a standalone, discrete component.

The overvoltage protection portion 120 of the input power protection device 100 can be configured to protect the load 140 from, for example, sudden or sustained increases in voltage produced by the power supply 130. In other words, the overvoltage protection portion 120 of the input power protection device 100 can be configured to provide voltage protection to the load 140 in response to, for example, an overvoltage event. In some embodiments, the overvoltage protection portion 120 of the input power protection device 100 can be configured to protect the load 140 from voltage produced by the power supply 130 based on one or more voltage conditions (e.g., a voltage level sustained over a specified period of time, a voltage exceeding a threshold voltage).

In some embodiments, the overvoltage protection portion 120 can be configured to change conduction state from a voltage regulation state to a shorted state (e.g., a high conduction/low resistance state). When in the voltage regulation state, the overvoltage protection portion 120 can be configured to limit (e.g., clamp) a voltage across the overvoltage protection device (and a downstream load) at a threshold voltage (e.g., a voltage limit, a clamping voltage). For example, if the overvoltage protection portion is, or includes, a Zener diode, the Zener diode can be configured to limit a voltage across the Zener diode at a Zener breakdown voltage when in the voltage regulation state. When in the shorted state, the overvoltage protection portion 120 may be in a thermally induced shorted state. In some embodiments, the shorted state can be a failure mode of the device where a physical change in the structure of the overvoltage protection device causes the shorting. In other words, the overvoltage protection portion 120 can be configured to change from the voltage regulation state to the shorted state in response to a temperature of the overvoltage protection portion 120 increasing beyond a threshold temperature. For example, if the overvoltage protection portion 120 is a Zener diode, migration of metals across a PN junction of the Zener diode in response to a temperature above a threshold temperature BT of the Zener diode can result in a short within the Zener diode (e.g., across the PN junction).

In some embodiments, once the overvoltage protection portion 120 has changed to the shorted state, the overvoltage protection portion 120 may not change back to the voltage regulation state. In other words, a change to the shorted state from the voltage regulation state can be an irreversible change (e.g., physical change). In some embodiments, the overvoltage protection portion 120 can be, or can include, a device configured to reversibly change from the shorted state back to the voltage regulation state.

Accordingly, a voltage output from the power supply 130 (and across the overvoltage protection portion 120) can be changed when the voltage output exceeds a threshold voltage while the overvoltage protection portion 120 is in the voltage regulation state, or if the temperature of the overvoltage protection portion 120 exceeds a threshold temperature and the overvoltage protection portion 120 changes to the shorted state. For example, the overvoltage protection portion 120 can be configured to limit a voltage from the power supply 130 (and across the overvoltage protection portion 120) when the voltage output exceeds a threshold voltage (while the overvoltage protection portion 120 is in a voltage regulation state). In some embodiments, after an overvoltage condition has ended, the voltage will no longer be limited by the overvoltage protection portion 120 (because the voltage across the overvoltage protection portion 120 will be below the threshold voltage). As another example, the overvoltage protection portion 120 can be configured to cause a short that limits a voltage output from the power supply 130 (and across the overvoltage protection portion 120) when the voltage output exceeds a threshold temperature and the overvoltage protection portion 120 changes to the shorted state. In some embodiments, the overvoltage protection portion 120 can be referred to as changing to a high conduction state or as failing short when limiting the voltage output from the power supply 130 when changing to the shorted state.

In some embodiments, the overvoltage protection portion 120 of the input power protection device 100 can be, or can include, for example, any type of transient voltage suppressor (TVS) (also can be referred to as a transient voltage suppression device). In some embodiments, the overvoltage protection portion 120 of the input power protection device 100 can be, or can include, for example, any type of device configured to change between a voltage regulation state (in response to voltage changes) and a shorted state (in response to temperature changes). In some embodiments, the overvoltage protection portion 120 can be configured to reversibly or irreversibly change between the voltage regulation state and the shorted state. In some embodiments, the overvoltage protection portion 120 of the input power protection device 100 can include one or more Zener diodes, one or more metal oxide varistors, and/or so forth.

The overcurrent protection portion 110 of the input power protection device 100 can be configured to protect the load 140 from, for example, sudden or sustained increases in current produced by the power supply 130. In other words, the overcurrent protection portion 110 of the input power protection device 100 can be configured to provide current protection to the load 140 in response to, for example, an overcurrent event. In some embodiments, the overcurrent protection portion 110 of the input power protection device 100 can be configured to protect the load 140 from current produced by the power supply 130 based on one or more current conditions (e.g., a current level sustained over a specified period of time, a current exceeding a threshold voltage, a short high current pulse). In some embodiments, the overcurrent protection portion 110 can be configured to cause a change in a conduction state from a high conduction state (e.g., a low resistive state) to a low conduction state (e.g., a high resistance state that prevents or limits (significantly limits) current from flowing to the load 140 when a current output from the power supply 130 (and through the overcurrent protection portion 110) exceeds a threshold current (within or for a specified period of time). For example, the overcurrent protection portion 110 can be configured to cause to cause an open circuit (e.g., melt to produce an open circuit, blow open to produce an open circuit) that prevents current from flowing to the load 140 when a current output from the power supply 130 (and through the overcurrent protection portion 110) exceeds a threshold current (within a specified period of time). In some embodiments, the overcurrent protection portion 110 can be referred to as failing open when limiting the current output from the power supply 130 as described. In some embodiments, after an overcurrent condition has ended, the overcurrent protection portion 110 can be configured to change conduction state from the low conduction state (e.g., the high resistance state) to the high conduction state (e.g., the low resistance state).

In some embodiments, the overcurrent protection portion 110 of the input power protection device 100 can be, or can include, any type of overcurrent protection device. In some embodiments, the overcurrent protection portion 110 of the input power protection device 100 can be, or can include, for example, any type of device configured to change between conduction states (e.g., from the high conduction state to the low conduction state). In other words, the overcurrent protection portion 110 can include any type of current sensitive switch device that responds to increased current draw by switching to a low conduction state (e.g., a high resistance state). In some embodiments, the overcurrent protection portion 110 of the input power protection device 100 can be, or can include, for example, a fuse, a silicon current limit switch, a polysilicon-based fuse, an electronic fuse (e-fuse), a polymer positive temperature coefficient (PPTC) device, a ceramic positive temperature coefficient (CPTC) device, and/or so forth. In some embodiments, the input power protection device 100 can be referred to as a fusing diode.

In this embodiment, the overcurrent protection portion 110 and the overvoltage protection portion 120 are integrated into the input power protection device 100 so that the input power protection device 100 is a single integrated component (e.g., single discrete component). In other words, the input power protection device 100 is a single integrated component that includes both the overcurrent protection portion 110 and the overvoltage protection portion 120. Specifically, the overcurrent protection portion 110 and the overvoltage protection portion 120 are integrated into a single package of the input power protection device 100 with three terminals—an input terminal 102, an output terminal 104, and a ground terminal 106 (which can collectively be referred to as terminals). In some embodiments, the terminals can be referred to as ports, pins, portions, and/or so forth (e.g., input port 102 can be referred to as input pin 102 or as input portion 102). Examples of physical characteristics of input power protection devices that are discrete components with both an overvoltage protection portion and an overcurrent protection portion are described in connection with FIGS. 6A through 9B.

As shown in FIG. 1, the input power protection device 100, the power supply 130, and the load 140 can be included in (e.g., integrated into) a computing device 10. In some embodiments, the computing device 10 can be, for example, a computer, a personal digital assistant (PDA), a host computer, an electronic measurement device, a data analysis device, a cell phone, an electronic device, and/or so forth.

Because the overcurrent protection portion 110 and the overvoltage protection portion 120 are integrated into a single component, assembly can be simplified and can result in reduced production costs. In some embodiments, the overcurrent protection portion 110 and the overvoltage protection portion 120 are integrated into a single component (i.e., the input power protection device 100) so that installation of a separate overcurrent protection device and overvoltage protection device into a computing device (e.g., such as computing device 10) may not be necessary. Instead, overcurrent protection and overvoltage protection can be provided by the input power protection device 100, which includes both the overcurrent protection portion 110 and the overvoltage protection portion 120. In some embodiments, circuit board space can be more efficiently allocated by using the input power protection device 100, which is a single component, than if overcurrent protection and overvoltage protection were achieved using multiple separate components.

In some embodiments, because the overcurrent protection portion 110 and the overvoltage protection portion 120 are integrated into the input power protection device 100, the overcurrent protection portion 110 and the overvoltage protection portion 120 can be configured to interoperate (e.g., can be matched) in a desirable fashion. Specifically, the overcurrent protection portion 110 and the overvoltage protection portion 120 can be configured (e.g., sized) so that the overvoltage conditions and the overcurrent conditions collectively operate in a desirable fashion. For example, the overvoltage protection portion 120 can be configured so that the overvoltage protection portion 120 may not cause the overcurrent protection portion 110 to, for example, prematurely change to a low conduction state (e.g., change to high resistance state, fail open, blow open, melt to produce an open circuit). If not properly matched, an overvoltage protection device can change to a shorted state (e.g., fail short, produce a short circuit) and can cause an overcurrent protection device (which is separate from the overvoltage protection device) to change to a low conduction state (e.g., fail open) at a fault condition, that without overvoltage protection portion change in state, would have kept the current below a threshold current of the overcurrent protection device.

In some embodiments, integration of the overcurrent protection portion 110 and the overvoltage protection portion 120 into a single, discrete component can result in a reduced risk of undesirable overvoltage protection portion 120 open failure modes (which can then result in undesirable damage to the load 140 and/or a fire). For example, if the overvoltage protection portion 120 is not properly matched to the overcurrent protection portion 110, the overvoltage protection portion 120 (rather than the overcurrent protection portion 110) may fail open and, consequently, a voltage across the load 140 may not be appropriately limited.

As described above, the overcurrent protection portion 110 and the overvoltage protection portion 120 can each be configured to independently provide power protection. For example, the overcurrent protection portion 110 can be configured to provide overcurrent protection in response to an overcurrent event, and the overvoltage protection portion 120 can be configured to provide overvoltage protection in response to an overvoltage event. In some embodiments, because the overcurrent protection portion 110 and the overvoltage protection portion 120 are integrated into the input power protection device 100, thermal coupling (represented by the dashed double-sided arrow) between the overcurrent protection portion 110 and the overvoltage protection portion 120 can also be used to provide power protection (e.g., overcurrent protection, overvoltage protection) to the load 140. Specifically, the thermal coupling can be a mechanism through which the overcurrent protection portion 110 and the overvoltage protection portion 120 can interact (e.g., interoperate) to provide power protection to the load 140. In some embodiments, such thermal coupling may not be possible if the overcurrent protection portion 110 and the overvoltage protection portion 120 are not integrated as a single component in the input power protection device 100.

For example, heat produced by the overcurrent protection portion 110, while drawing an undesirable level of current, can be transferred to the overvoltage protection portion 120. The heat transferred to the overvoltage protection portion 120 can cause the overvoltage protection portion 120 to change from a voltage regulation state to a shorted state (e.g., fail short, low resistivity state) and thereby increase draw current through the overcurrent protection portion 110. The current drawn through the overcurrent protection portion 110, in response to the current drawn through the overvoltage protection portion 120, can cause the overcurrent protection portion 110 to change to a low conduction state (e.g., fail open, a high resistivity state) and protect the load 140 from an undesirable level of current and limit the heat that the overcurrent protection portion 110 can transfer to a board (e.g., a PCB). Thus, when the overvoltage protection portion 120 is thermally coupled to the overcurrent protection portion 110, the overcurrent protection portion 110 can be configured to heat the overvoltage protection portion 120 to its critical thermal break down temp (which can be, by design, lower than the overcurrent protection portion 110 element open temp), the overvoltage protection portion 120 will changed to a shorted state, pull more current through the overcurrent protection portion 110, and cause the overcurrent protection portion 110 to change to a low conduction state. In some thermally decoupled systems using multiple separate components, relatively low currents near the threshold current (e.g., rated current, open current) of the overcurrent protection portion 110 can increase the overcurrent protection portion 110 temperature and related board temperature to dangerous (e.g., damaging) levels, without causing the overcurrent protection portion 110 to change to a low conduction state. If the overcurrent protection portion 110 is, or includes, a fuse, the fuse can achieve very high temperature when running near the threshold current—this can result in a board fire in some systems.

In some embodiments, the power supply 130 can be any type of power supply such as, for example, a switched mode power supply, a direct-current (DC) power supply, an alternating-current (AC) power supply, and/or so forth. In some embodiments, the power supply 130 can include a power source that can be any type of power source such as, for example, a direct current (DC) power source such as a battery, a fuel cell, and/or so forth.

Figure 2:
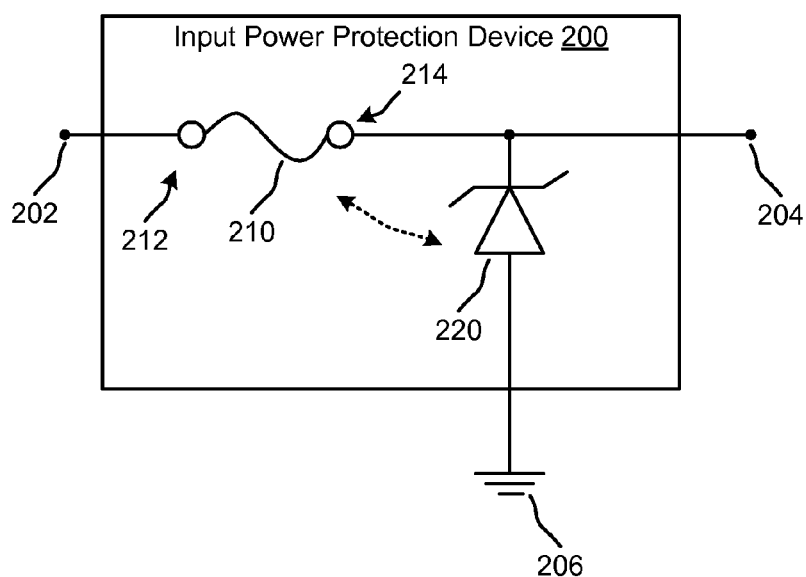
FIG. 2 is a schematic of an input power protection device.

FIG. 2 is a schematic of an input power protection device 200. As shown in FIG. 2, the input power protection device 200 includes a fuse 210 (also can be referred to as a fuse device), which functions as an overcurrent protection portion of the input power protection device 200. In some embodiments, the fuse 210 can be formed of any type of material (or combination thereof) such as, for example, aluminum, tin, copper, lead, brass, bronze, nichrome, and/or so forth. The input power protection device 200 also includes a Zener diode 220 (which can be a type of TVS diode) (which will be generally referred to as a Zener diode device), which functions as an overvoltage protection portion of the input power protection device 200. In some embodiments, the Zener diode 220 can be a semiconductor device formed using a PN junction (which is formed with or associated with a p-type semiconductor and an n-type semiconductor) in any type of semiconductor materials such as, for example, silicon (e.g., a doped silicon), gallium arsenide, germanium, silicon carbide, and/or so forth.

In some embodiments, the Zener diode 220 can include a silicon substrate 150 that includes (or is associated with) at least a portion of a PN junction. In some embodiments, the PN junction can be produced in a single or multiple crystals of semiconductor, for example, by doping, using ion implantation, diffusion of dopants, epitaxial growth, and/or so forth. Although this embodiment, and many of the embodiments described herein, is discussed in the context of a Zener diode, any type of overvoltage protection portion may be used with, or instead of, the Zener diode. For example, the overvoltage protection portion of the input power protection device 200 could be any type of TVS device.

As shown in FIG. 2, the fuse 210 and the Zener diode 220 are integrated into the input power protection device 200 so that the input power protection device 200 functions as a single integrated component. In other words, the fuse 210 and the Zener diode 220 can be packaged into the input power protection device 200 so that the input power protection device 200 functions as a standalone discrete component.

Because the fuse 210 and the Zener diode 220 are integrated into the input power protection device 200, the input power protection device 200 includes three terminals. When each functioning as standalone components, a fuse is typically packaged as a two-terminal device and a Zener diode is also typically packaged as a two-terminal device. As shown in FIG. 2, the three terminals of the input power protection device 200 are an input terminal 202, an output terminal 204, and a ground terminal 206. As shown in FIG. 2, the input terminal 202 is coupled to (e.g., electrically coupled to) an end 212 of the fuse 210. The Zener diode 220 is coupled to (e.g., electrically coupled to) end 214 of the fuse 210, which is also coupled to (e.g., electrically coupled to) the output terminal 204. Thus, the end 214 of fuse 210 and the Zener diode 220 are both coupled to the output terminal 204 and function as a single node. The Zener diode 220 is also coupled to the ground terminal 206.

Because the input power protection device 200 includes a three terminal architecture, the fuse 210 can fail open (also can be referred to as blowing open) and interrupt current to both the Zener diode 220 and a downstream system (e.g., a load) coupled to the input power protection device 200 via the output terminal 204. In some embodiments, the fuse 210 can fail open when the fuse 210 melts to produce an open circuit. In some embodiments, the fuse 210 can fail open in response to a downstream overcurrent event, an overvoltage event, and/or a thermal coupling mechanism. Examples of these different power protection mechanisms of an input power protection device that includes an overcurrent protection portion (e.g., a fuse device) and an overvoltage protection portion (e.g., a Zener diode) are illustrated in the graphs shown in FIGS. 3A through 5B.

Figure 4A:
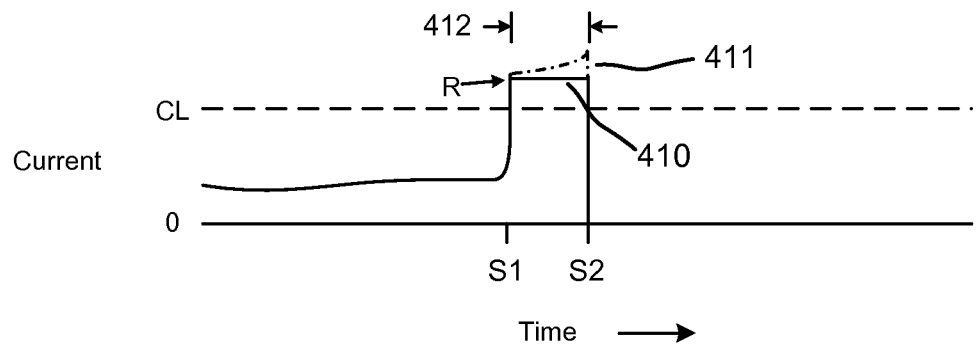
FIGS. 4A through 4C are graphs that illustrate power protection provided by an input power protection device in response to an overcurrent event.
Figure 4B:
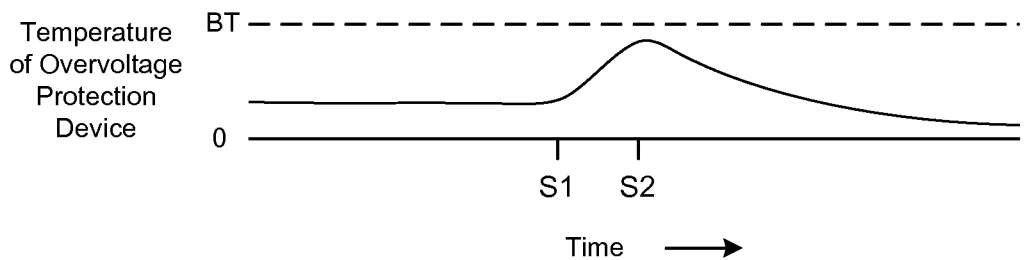
Figure 4C:
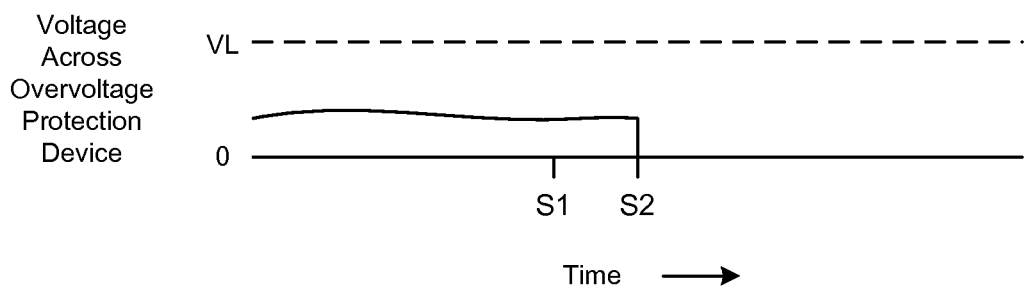
Figure 5A:
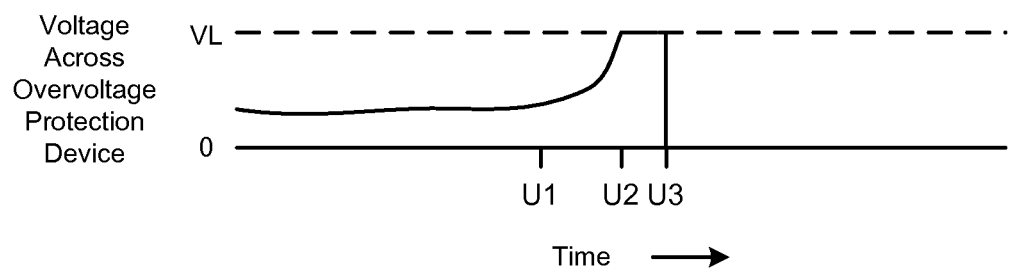
FIGS. 5A through 5C are graphs that illustrate power protection provided by an input power protection device in response to an overvoltage event.
Figure 5B:
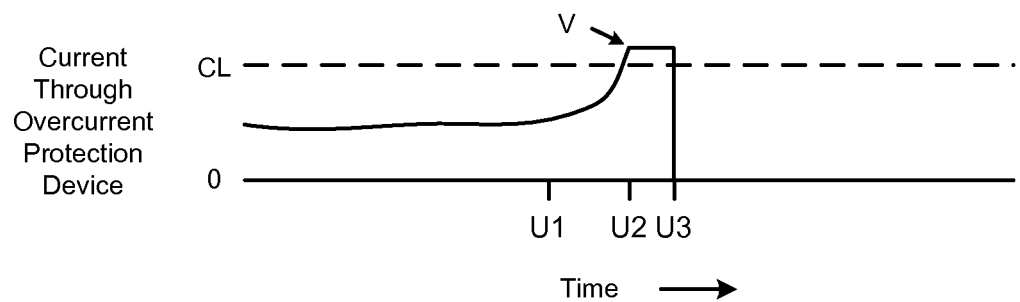

Specifically, FIGS. 3A through 3D are graphs that illustrate power protection provided by an input power protection device (such as those shown in FIGS. 1 and 2) via a thermal coupling mechanism. FIGS. 4A through 4C are graphs that illustrate power protection provided by an input power protection device in response to an overcurrent event. FIGS. 5A and 5B are graphs that illustrate power protection provided by an input power protection device in response to an overvoltage event.

Although the behavior of the components described in connection with FIGS. 3A through 5B are described as, for example, making transitions at specified voltages, currents, and/or at specified times, when implemented (e.g., implemented using semiconductor devices), the transitions of the components may occur slightly before or slightly after the specified voltages, currents, and/or specified times. Specifically, variations in breakdown voltages, thermal conductivity, processing variations, temperature variations, switching times of devices, circuit transition delays, and/or so forth can result in conditions (e.g., non-ideal conditions) that can trigger transitions of components slightly before or slightly after the voltages, currents, and/or times in FIGS. 3A through 5B. As shown in FIGS. 3A through 5B, time is increasing to the right.

Figure 3A:
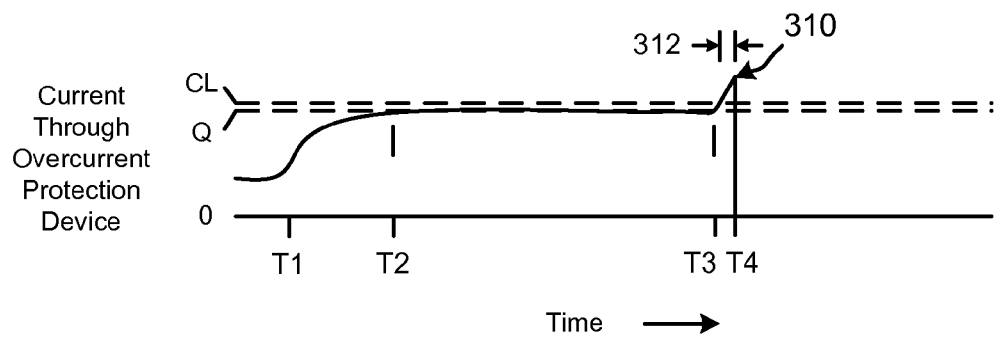
FIGS. 3A through 3D are graphs that illustrate power protection provided by an input power protection device via a thermal coupling mechanism.

FIG. 3A is a graph that illustrates a current through an overcurrent protection device included in an input power protection device. The overcurrent protection device can be a fuse device such as fuse 210 of the input power protection device 200 shown in FIG. 2. In some embodiments, the overcurrent protection device can be included in, or can be, an overcurrent protection portion 110 of the input power protection device 100 shown in FIG. 1.

As shown in FIG. 3A, current through the overcurrent protection device increases starting at approximately time T1 until the current is at current Q, which is below the threshold current CL, at approximately time T2. The current through the overcurrent protection device is approximately at current Q between times T2 and T3. In some embodiments, the threshold current CL can represent a rated current of the overcurrent protection device, which can be approximately the maximum current at which the overcurrent protection device can continuously conduct current without failing open (e.g., blowing open). In other words, the threshold current CL can represent the current at which the overcurrent protection device can continuously conduct current without interrupting current flow to a downstream load (e.g., circuit). In some embodiments, the threshold current CL can represent the minimum steady-state current at which the overcurrent protection device changes from a high conduction state to a low conduction state (e.g., fails open). In some embodiments, threshold current CL can be, for example, between microamps and amps. For example, the threshold current CL can be 2 microamps, 5 milliamps, 10 amps, 100 amps, and so forth.

Figure 3B:
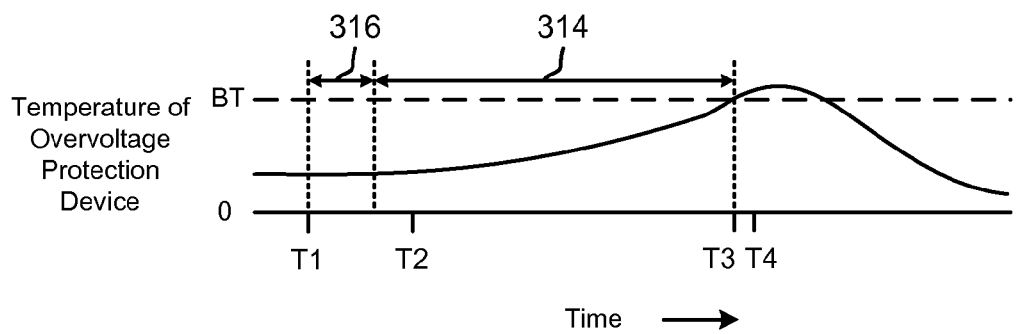
Figure 3C:
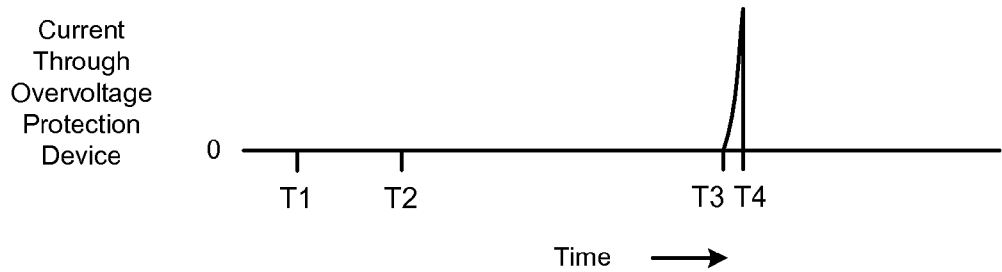
Figure 3D:
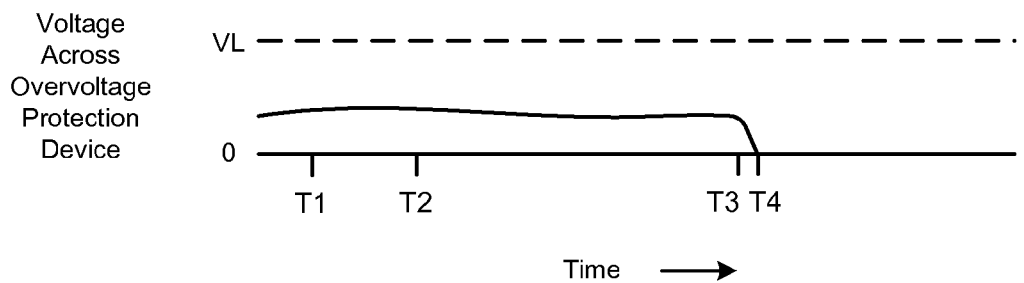

FIG. 3B is a graph that illustrates a temperature of an overvoltage protection device (e.g., a transient voltage suppression (TVS) device) integrated into the input power protection device with the overcurrent protection device described in connection with FIG. 3A. FIG. 3C is a graph that illustrates a current through the overvoltage protection device, and FIG. 3D is a graph that illustrates a voltage across the overvoltage protection device. The overvoltage protection device can be, for example, a Zener diode such as Zener diode 220 of the input power protection device 200 shown in FIG. 2. In some embodiments, the overvoltage protection device can be included in, or can be, an overvoltage protection portion 120 of the input power protection device 100 shown in FIG. 1.

As shown in FIG. 3B, in response to the current through the overcurrent protection device increasing to current Q (shown in FIG. 3A), the temperature of the overvoltage protection device starts increasing between times T1 and T2. Specifically, the temperature of the overvoltage protection device can start increasing between times T1 and T2 in response to heat produced by the overcurrent protection device in response to the current through the overcurrent protection device. The heat can be thermally conducted through, for example, packaging (e.g., molding) that is used to integrate (or package) the overcurrent protection device and the overvoltage protection device into the input power protection device, or other device structure.

In this embodiment, the overvoltage protection device is configured to change from a voltage regulation state to a shorted state (e.g., fail short) when the temperature of the overvoltage protection device reaches a threshold temperature BT. In some embodiments, the threshold temperature BT can be referred to as a threshold breakdown temperature, or as a critical breakdown temperature—this shorting state can be achieved even if voltage threshold VL is not exceeded. When in the voltage regulation state, the overvoltage protection device can be configured to limit a voltage across of the overvoltage protection device (and a downstream load). For example, if the overvoltage protection device is a Zener diode, the Zener diode can be configured to limit a voltage across the Zener diode at a Zener breakdown voltage when in the voltage regulation state. The voltage regulation limit of the overvoltage protection device is shown in FIG. 3D as voltage threshold VL (also can be referred to as a reverse breakdown voltage or as a clamping voltage).

When in the shorted state, the overvoltage protection device can become shorted and can then be configured to conductively draw a current. When in the shorted state, the overvoltage protection device may be in a thermally induced shorted state that can be a failure mode of the device where a physical change in the structure of the overvoltage protection device causes the shorting. For example, if the overvoltage protection device is a Zener diode, migration of metals across a PN junction of the Zener diode in response to a temperature above the threshold temperature BT can result in a short within the Zener diode (e.g., across the PN junction). In some embodiments, once the overvoltage protection device has changed to the shorted state, the overvoltage protection device may not change back to the voltage regulation state. In other words, a change to the shorted state can be an irreversible physical change. In some embodiments, the overvoltage protection device can be, or can include, a device configured to reversibly change from the shorted state back to the voltage regulation state, such as via thermally induced avalanche breakdown, for example.

As shown in FIG. 3B, the temperature of the overvoltage protection device reaches the threshold temperature BT at time T3, at which time, the overvoltage protection device fails short (changes to the shorted state). In some embodiments, the threshold temperature BT can be between, for example, 200 and 700 degrees Fahrenheit (e.g., 350 degrees Fahrenheit, 400 degrees Fahrenheit, 450 degrees Fahrenheit, and so forth). In some embodiments, the overvoltage protection device can be configured so that the threshold temperature BT is higher or lower than that shown in FIG. 3B. In some embodiments, the overvoltage protection device can be made of material (e.g., semiconductor material) that intrinsically has a specified threshold temperature BT. In some embodiments, the overvoltage protection device can be configured so that a thermal conductivity coupling of the overvoltage protection device results in a time shorter or longer than that shown in FIG. 3B.

In response to the overvoltage protection device changing from the voltage regulation state to the shorted state (e.g., failing short), current drawn through the through the overvoltage protection device rapidly increases as shown in FIG. 3C. Specifically, current through the overvoltage protection device rapidly increases starting at time T3, which is approximately the time at which the overvoltage protection device changes to the shorted state (e.g., fails short).

Also, in response to the overvoltage protection device changing to a shorted state (e.g., failing short), current drawn through the overcurrent protection device increases starting at time T3 as shown in FIG. 3A. The current drawn through overcurrent protection device increases as the current drawn through the overvoltage protection device increases. The current drawn through overcurrent protection device can increase in response to the current drawn through the overvoltage protection device increasing. As shown in FIG. 3A, the current from the overcurrent protection device increases from current Q starting at time T3 to a peak current 310 beyond the threshold current CL (for simplicity the associated time component of CL is not discussed). In response to the current through the overcurrent protection device increasing beyond the threshold current CL, the overcurrent protection device changes to a low conduction state (e.g., fails open) at time T4. When the overcurrent protection device changes to the low conduction state (e.g., fails open) at time T4, the current through the overcurrent protection device decreases to zero (or a relatively low value) (because the overcurrent protection device has changed to a low conduction state (e.g., failed open)).

As shown in FIG. 3A, the overcurrent protection device changes to the low conduction state (e.g., fails open) after the current through the overcurrent protection device is above the threshold current CL during time period 312. In some embodiments, the overcurrent protection device may change to the low conduction state (e.g., fail open) when a temperature of the overcurrent protection device causes at least a portion of the overcurrent protection device to, for example, melt in response to current flowing through the overcurrent protection device. Thus, the time period during which the overcurrent protection device changes to the low conduction state (e.g., fails open) can depend on the level of current flowing through the overcurrent protection device, a size of the overcurrent protection device, a thermal conductivity of the overcurrent protection device, a resistivity of the overcurrent protection device, and/or so forth. In some embodiments, the overcurrent protection device can be configured so that the overcurrent protection device changes to the low conduction state (e.g., fails open) after the current to the overcurrent protection devices of the threshold current CL during a time period shorter than time period 312, or during a time period longer than time period 312.

As shown in FIG. 3C, the current (shown on a non-log scale) through the overvoltage protection device drops to zero (or a relatively low value) at time T4 in response to the overcurrent protection device changing to the low conduction state (e.g., failing open) at time T4 (as shown in FIG. 3A). In some embodiments, the current through the overvoltage protection device before time T3 can be greater than zero. In some embodiments, the current through the overvoltage protection device before time T3 can be a relatively small current. In some embodiments, the current through the overvoltage protection device before time T3 can be approximately a leakage current through the overvoltage protection device. In FIG. 3C, because current is shown on a non-log scale, such leakage current would be near zero, as illustrated.

As shown in FIG. 3D, the voltage across the overvoltage protection device is approximately constant during operation of the input power protection device until the overcurrent protection device starts changing to the low conductivity state (e.g., fails open) starting at time T3 (as shown in FIG. 3A). In response to the overcurrent protection device changing to the low conductivity state (e.g., failing open), the voltage across the overvoltage protection device drops to zero (or a relatively low value). In some embodiments, the failure of the overvoltage protection device in response to the temperature increase beyond the threshold temperature BT can be referred to as crowbar failure. As shown in FIG. 3D, the voltage across the overvoltage protection device is below a threshold voltage VL of the overvoltage protection device. The threshold voltage VL of the overvoltage protection device can be a voltage (e.g., a voltage regulation limit, a clamping voltage) at which the overvoltage protection device breaks down (e.g., break down voltage of a Zener diode or Zener voltage) when the overvoltage protection device is in the voltage regulation state. The breakdown of the overvoltage protection device at or above the threshold voltage VL can be a controlled breakdown (and a reversible breakdown) driven by input voltage, which is contrasted with the temperature induced breakdown when the overvoltage protection device changes to the shorted or relatively high conduction state. In some embodiments, the voltage across the overvoltage protection device can vary (e.g., increase, decrease) during operation of the input power protection device. In some embodiments, threshold voltage VL can be, for example, between millivolts and volts. For example, the threshold voltage VL can be 0.5 volts, 1.5 volts, 5 volts, 50 volts, 500 volts, 1000 volts, and so forth.

As shown in FIG. 3B, the temperature of the overvoltage protection device begins to decrease after the overcurrent protection device changes to the low conduction state (e.g., fails open) at time T4. In some embodiments, the temperature of the overvoltage protection device can decrease because current is relatively limited or no longer flowing through the overcurrent protection device (or through any portion of the input power protection device). In some embodiments, the temperature of the overvoltage protection device can decrease as the overvoltage protection device cools via thermal cooling mechanisms such as convection, conduction, and/or so forth. In some embodiments, despite the cooling of the overvoltage protection device, the overvoltage protection device can remain in the shorted state.

In this embodiment, the temperature of the overvoltage protection device increases in temperature until the temperature of the overvoltage protection device reaches the threshold temperature BT in response to the increasing current to the overcurrent protection device (shown in FIG. 3A) during time period 314 (shown in FIG. 3B). BT may vary depending on the particular embodiment. Also, as shown in FIGS. 3A and 3B, the temperature of the overvoltage protection device starts increasing between times T1 and T2 even though the current through the overcurrent protection device starts to increase at time T1. In other words, increase in the temperature of the overvoltage protection device is delayed relative to the increase in current through the overcurrent protection device. This delay is shown in FIG. 3B as delay time period 316.

In some embodiments, the overvoltage protection device (e.g., thermal conductivity of the overvoltage protection device) can be configured so that the overvoltage protection device reaches the threshold temperature BT during a time period shorter or longer than time period 314 shown in FIG. 3B. In some embodiments, the overvoltage protection device can be configured so that the delay time period 316 is shorter or longer than that shown in FIG. 3B. In some embodiments, a distance between the overvoltage protection device and the overcurrent protection device (which are integrated into the input power protection device) and/or a material between the overvoltage protection device the overcurrent protection device can be defined so that the delay time period 316 is shorter or longer than that shown in FIG. 3B and/or so that the overvoltage protection device reaches threshold temperature BT during a time period shorter or longer than the time period 314 shown in FIG. 3B. In some embodiments, the material between the overvoltage protection device and overcurrent protection device can be configured so that the material is a thermally conductive material (e.g., is a material that has a specified thermal conductivity) and/or an electrically insulating material such as, for example, silicon oxides, intrinsic semiconductors, polysilicon, polymer packaging glass, and/or so forth.

In some embodiments, an increased leakage current (which can be temperature-induced) through the overvoltage protection device could cause the overcurrent protection device to fail open. For example, an increase in the temperature of the overvoltage protection device could cause the overvoltage protection device to draw a relatively high leakage current through the overvoltage protection device and through the overcurrent protection device. Even though the overvoltage protection device may not have failed short, the relatively high leakage current drawn through the overcurrent protection device by the overvoltage protection device (plus any additional current already flowing through the overcurrent protection device) could cause the overcurrent protection device to fail open (within a period of time).

As illustrated by the graphs shown in FIGS. 4A and 4C, change in conduction state (e.g., blowing open) of the overcurrent protection device can be caused by a chain events starting with a current flow (e.g., a sustained current flow) through the overcurrent protection device below the threshold current CL. Specifically, the change in conduction state of the overcurrent protection is caused by a positive feedback loop involving heat conduction (or heat transfer) between the overcurrent protection device and the overvoltage protection device. Current drawn through the overcurrent protection device results in heat transfer to the overvoltage protection device. As heat is transferred to the overvoltage protection device, the overvoltage protection causes a higher level of current to be drawn through the overcurrent protection device until the overcurrent protection device changes to the low conduction state (e.g., fails open).

FIG. 4A is a graph that illustrates a current 410, through a load, and a current 411, through an overcurrent protection device included in an input power protection device, superimposed on a single graph. The overcurrent protection device can be an overcurrent protection device such as fuse 210 of the input power protection device 200 shown in FIG. 2. In some embodiments, the overcurrent protection device can be included in, or can be, an overcurrent protection portion 110 of the input power protection device 100 shown in FIG. 1.

As shown in FIG. 4A, the current 410 through the load and current 411 through the overcurrent protection device increases rapidly starting at approximately time S1 until the currents are at approximately current R, which is above the threshold current CL. While the current 410 through the load may remain constant, as shown in FIG. 4A, the current 411 through the overcurrent protection device can continue to increase as a result of thermal interaction (e.g., positive thermal feedback) between the overcurrent protection device and an overvoltage protection device, such as a thermally-activated current sink, as described herein. In this embodiment, the current 411 through the overcurrent protection device continues to increase between times S1 and S2 until the overcurrent protection device changes to a low conduction state (e.g., fails open) at time S2, at which time both the current 410 and the current 411 drop to zero (or relatively low currents). Accordingly, in this situation, the overcurrent protection device is configured to change to a low conduction state (e.g., fail open) when the current through the overcurrent protection device (e.g., the load current) is above the threshold current CL (which can represent, for example, a rated current of the overcurrent protection device) for at least a specified period of time. In this embodiment, the current is limited to current R based on a resistance of the fault causing the overcurrent event and/or a power supply resistance. In some embodiments, a current profile resulting in the current through the overcurrent protection device exceeding the threshold current CL can be different than that shown in FIG. 4A.

As shown in FIG. 4A, the overcurrent protection device changes to a low conduction state (e.g., fails open) after the current through the overcurrent protection device is above the threshold current CL during time period 412 (during which the current 411 may continue to increase). In some embodiments, the overcurrent protection device may change to the low conduction state (e.g., fail open) when a temperature of the overcurrent protection device causes at least a portion of the overcurrent protection device to, for example, melt in response to current flowing through the overcurrent protection device. Thus, the time period after which the overcurrent protection device changes to the low conduction state (e.g., fails open) can depend on the level of current flowing through the overcurrent protection device, a size of the overcurrent protection device, a thermal conductivity of the overcurrent protection device, a resistivity of the overcurrent protection device, and/or so forth. In some embodiments, the overcurrent protection device can be configured so that the overcurrent protection device changes to the low conduction state (e.g., fails open) after the current to the overcurrent protection devices of the threshold current CL during a time period shorter than time period 412, or during a time period longer than time period 412.

FIG. 4B is a graph that illustrates a temperature of an overvoltage protection portion (e.g., a transient voltage suppression (TVS) device) integrated into the input power protection device with the overcurrent protection device described in connection FIG. 4A. FIG. 4C is a graph that illustrates a voltage across the overvoltage protection device. The overvoltage protection device can be, for example, a Zener diode such as Zener diode 220 of the input power protection device 200 shown in FIG. 2. In some embodiments, the overvoltage protection device can be included in, or can be, the overvoltage protection portion 120 of the input power protection device 100 shown in FIG. 1.

As shown in FIG. 4B, in response to the current through the overcurrent protection device increasing to current R (shown in FIG. 4A), the temperature of the overvoltage protection device increases (e.g., shown for simplicity as increasing at nearly a linear rate, which may be highly dependent on current profiles and thermal dynamics of given system) between times S1 and S2. Specifically, the temperature of the overvoltage protection device increases between times S1 and S2 in response to heat produced by the overcurrent protection device in response to the current R through the overcurrent protection device. The heat can be thermally conducted through, for example, packaging (e.g., molding) that is used to integrate the overcurrent protection device and the overvoltage protection device into the input power protection device. Similarly, heat can be conducted directly through the silicon substrate or circuit components in a completely integrated device (e.g., an integrated circuit (IC)).

After the overcurrent protection device changes to the low conduction state (e.g., fails open) at time S2 (as shown in FIG. 4A), the temperature of the overvoltage protection device begins to decrease (e.g., decreases asymptotically) as shown in FIG. 4B. In some embodiments, the temperature of the overvoltage protection device can decrease because current is limited or no longer flowing through the overcurrent protection device (or through any portion of the input power protection device). In some embodiments, the temperature of the overvoltage protection device can decrease as the overvoltage protection cools via mechanisms such as convection, conduction, and/or so forth. In this embodiment, the overvoltage protection device remains in the voltage regulation state and does not change to the shorted state because the temperature of the overvoltage protection device does not exceed the threshold temperature BT.

As shown in FIG. 4C, the voltage across the overvoltage protection device is approximately constant during operation of the input power protection device until the overcurrent protection device changes to the low conduction state (e.g., fails open) at time T4 (as shown in FIG. 4A). In response to the overcurrent protection device changing to the low conduction state (e.g., failing open), the voltage across the overvoltage protection device drops to zero (or a relatively low value). As shown in FIG. 4C, the voltage across the overvoltage protection device is below a threshold voltage VL of the overvoltage protection device. The threshold voltages VL of the overvoltage protection device can be a voltage (e.g., a voltage regulation limit, a clamping voltage) at which the overvoltage protection device breaks down (e.g., break down voltage of a Zener diode) when the overvoltage protection device is in the voltage regulation state. In some embodiments, the voltage across the overvoltage protection device can vary (e.g., increase, decrease) during operation of the input power protection device.

In some embodiments, heat produced by overcurrent protection device in response to the current through the overcurrent protection device increasing (as shown in FIG. 4A) can be transferred to the overvoltage protection device. The temperature of the overvoltage protection device can cause the overvoltage protection device to change to the shorted state (e.g., fail short) and draw a current. In some embodiments, the current drawn through the overvoltage protection device can result in a higher current drawn through the overcurrent protection device (than shown in FIG. 4A) and can cause the overcurrent protection device to change to the low conduction state (e.g., fail open) before time S2. As illustrated by the graphs shown in FIG. 3A through 3D and the graphs shown in FIGS. 4A and 4C, change in the conduction state (e.g., blowing) of the overcurrent protection device can be directly caused by a current above the threshold current CL of the overcurrent protection device or can be initially triggered by a current below the threshold current CL (via the positive feedback loop discussed above).

FIG. 5A is a graph that illustrates a voltage of an overvoltage protection device integrated into an input power protection device. The overvoltage protection device can be, for example, a Zener diode such as Zener diode 220 of the input power protection device 200 shown in FIG. 2. In some embodiments, the overvoltage protection device can be included in, or can be, the overvoltage protection portion 120 of the input power protection device 100 shown in FIG. 1.

As shown in FIG. 5A, the voltage across the overvoltage protection device increases starting at approximately time U1 until the voltage is at the threshold voltage VL at approximately time U2. In this embodiment, the overvoltage protection device remains in the voltage regulation state and does not change to the shorted state. The voltage across the overvoltage protection device can increase in response to the overvoltage event. In this embodiment, the voltage across the overvoltage protection device is approximately at the threshold voltage VL between times U2 and U3 until the overcurrent protection device changes to a low conduction state (e.g., fails open) at time U3 (shown in FIG. 5B), at which time the voltage drops to zero (or a relatively low value). The threshold voltage VL of the overvoltage protection device can be a voltage (e.g., a voltage regulation limit, a clamping voltage) at which the overvoltage protection device breaks down (e.g., break down voltage of a Zener diode) when the overvoltage protection device is in the voltage regulation state. In some embodiments, a voltage profile resulting in the voltage across the overvoltage protection device reaching the threshold voltage VL can be different than that shown in FIG. 5A.

FIG. 5B is a graph that illustrates a current through an overcurrent protection device included in the input power protection device with the overvoltage protection device described in connection with FIG. 5A. The overcurrent protection device can be an overcurrent protection device such as fuse 210 of the input power protection device 200 shown in FIG. 2. In some embodiments, the overcurrent protection device can be included in, or can be, an overcurrent protection portion 110 of the input power protection device 100 shown in FIG. 1.

As shown in FIG. 5B, current through the overcurrent protection device increases starting at approximately time U1 until the current is at current V at approximately time U2, which is above the threshold current CL. The current through the overcurrent protection device can increase rapidly in response to the voltage across the overvoltage protection device increasing in response to the overvoltage event. In this embodiment, the current through the overcurrent protection device is approximately at current V between times U2 and U3 until the overcurrent protection device fails open at time U3, at which time the current drops to zero (or a relatively low value). The overcurrent protection device is configured to change to the low conduction state (e.g., fail open) when the current through the overcurrent protection device is above the threshold current CL (which can represent, for example, a rated current of the overcurrent protection device) for at least a specified period of time. In this embodiment, the current is limited to current V because this is the current drawn to cap the voltage across the overvoltage protection device at the threshold voltage VL of the overvoltage protection device.

Similar to the overcurrent protection devices described above, the overcurrent protection device corresponding with FIG. 5B is configured to change to the low conduction state (e.g., fail open) after the current through the overcurrent protection device is above the threshold current CL during a finite period of time. As shown in FIGS. 5A and 5B, the overvoltage protection device and the overcurrent protection device are configured so that when the voltage across the overvoltage protection device is at the threshold voltage, current through the overcurrent protection device will cause the overcurrent protection device to change to the low conduction state (e.g., fail open). In other words, the overvoltage protection device and the overcurrent protection device are collectively configured so that the overcurrent protection device will change to the low conduction state (e.g., fail open) at a desirable voltage across the overvoltage protection device.

In this embodiment, the current through the overcurrent protection device increases proportionally with the voltage increase across the overvoltage protection device shown in FIG. 5A. In some embodiments, if a load coupled to the input power protection device is an active load (rather than a resistive load), the current profile through the overcurrent protection device can be different than that shown in FIG. 5B.

Figure 5C:
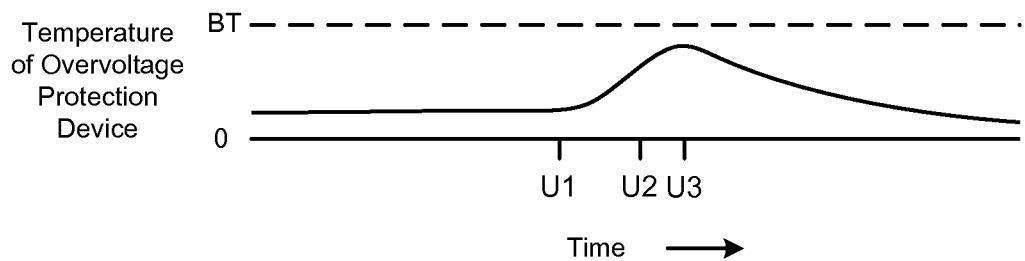

FIG. 5C is a graph that illustrates a temperature of an overvoltage protection portion (e.g., a transient voltage suppression (TVS) device) integrated into the input power protection device with the overcurrent protection device described in FIGS. 5A and 5B. As shown in FIG. 5C, in response to the current through the overcurrent protection device increasing to current V (shown in FIG. 5B), the temperature of the overvoltage protection device increases (e.g., increases at nearly a linear rate) between times U1 and U3, but does not exceed the threshold temperature BT of the overvoltage protection device. Specifically, the temperature of the overvoltage protection device increases between times U1 and U3 in response to heat produced by the overcurrent protection device in response to the current V through the overcurrent protection device. The heat can be thermally conducted through, for example, packaging (e.g., molding), or any other device structure, that is used to integrate the overcurrent protection device and the overvoltage protection device into the input power protection device.

After the overcurrent protection device changes to the low conduction state (e.g., fails open) at time U3 (as shown in FIG. 5B), the temperature of the overvoltage protection device begins to decrease (e.g., decreases asymptotically) as shown in FIG. 5C. In some embodiments, the temperature of the overvoltage protection device can decrease because current is limited or no longer flowing through the overcurrent protection device (or through any portion of the input power protection device). In some embodiments, the temperature of the overvoltage protection device can decrease as the overvoltage protection cools via mechanisms such as convection, conduction, and/or so forth. In this embodiment, the overvoltage protection device remains in the voltage regulation state and does not change to the shorted state because the temperature of the overvoltage protection device does not exceed the threshold temperature BT.

Figure 6B:
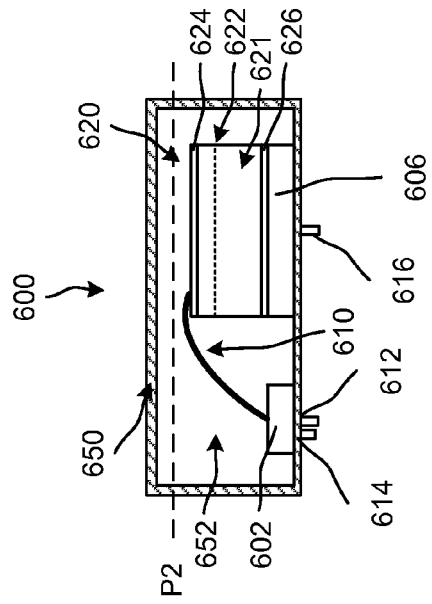
FIG. 6B is a block diagram that illustrates a side cross-sectional view of the input power protection device shown in FIG. 6A.
Figure 6A:
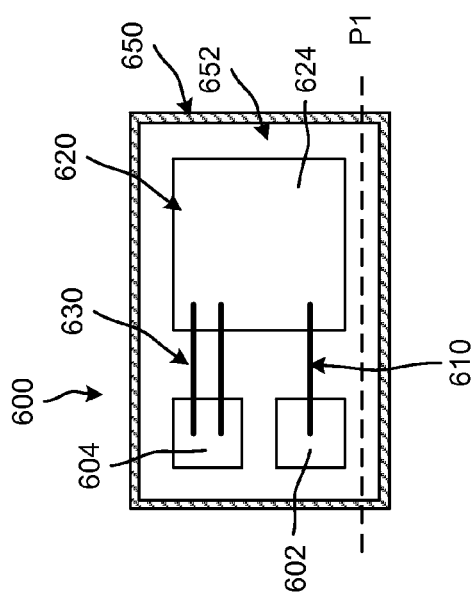
FIG. 6A is a block diagram that illustrates a top cross-sectional view of an input power protection device.

FIG. 6A is a block diagram that illustrates a top cross-sectional view of an input power protection device 600. FIG. 6B is a block diagram that illustrates a side cross-sectional view of the input power protection device 600 shown in FIG. 6A. The side cross-sectional view of the input power protection device 600 shown in FIG. 6B is cut along line P1, which is shown as a dashed line in FIG. 6A. The top cross-sectional view of the input power protection device 600 shown in FIG. 6A is cut along the line P2, which is shown as a dashed line in FIG. 6B.

In the embodiment shown in FIGS. 6A and 6B, the input power protection device 600 includes a fuse 610 that functions as an overcurrent protection portion and a Zener diode 620 that functions as an overvoltage protection portion. In this embodiment, the fuse 610 is defined by a wire that is coupled to (e.g., wire bonded to) an input terminal 602 and coupled to (e.g., wire bonded to) a metal plate 624 that is part of the Zener diode 620. In other words, the fuse 610 can be a wire bond fuse.

In some embodiments, the fuse 610 can be any type of fuse. For example, the fuse can be a narrow metal structure fuse, an on-diode fuse layer, or can be formed using some other technology. In some embodiments, the fuse 610 can be formed of any type of material such as, for example, aluminum, tin, copper, lead, brass, bronze, nichrome, and/or so forth.

As shown in FIG. 6A, the Zener diode 620 can be coupled to an output terminal 604 of the input power protection device 600 via conductors 630. In this embodiment, the conductors 630 include two separate conductors (i.e., two separate wires). In some embodiments, each of the conductors 630 can be made of the same material as the fuse 610. In some embodiments, the conductors 630 can include more or less wires than shown in FIG. 6A.

In some embodiments, each of the conductors 630 can be approximately (e.g., substantially) the same size, material, and resistance as the fuse 610. Because the conductors 630 includes two separate wires and the fuse 610 is made of one wire, the fuse 610 will fail open before the conductors 630 fail open in response to current flowing between the input terminal 602 and the output terminal 604 via the fuse 610 and the conductors 630. The fuse 610 will fail open before the conductors 630 fail open because the cross-sectional area of the fuse 610 is smaller than the collective cross-sectional area of the conductors 630. In some embodiments, the output terminal 604 may be coupled to the Zener diode 620 using a device (or connection(s)) different than the conductors 630 shown in FIG. 6A. Examples of different device (or connection(s)) between the Zener diode 620 and the output terminal 604 are shown in FIGS. 7A through 8B.

As shown in FIG. 6B, the Zener diode 620 includes a semiconductor 621 that has a PN junction 622. The metal plate 624 is disposed on a top portion of the semiconductor 621 and a metal plate 626 is disposed on the bottom portion of the semiconductor 621. In some embodiments, the metal plate 624 and/or the metal plate 626 can be defined by metal disposed on (e.g., sputtered on) the semiconductor 621 using semiconductor processing means. In some embodiments, the metal plate 624 and/or the metal plate 626 may or may not cover the entire top portion and/or bottom portion of the semiconductor 621. In some embodiments, the metal plate 624 and/or the metal plate 626 may be disposed on the semiconductor 621 before the semiconductor 621 is cut (e.g., cut using a saw) into an individual die that can be included in the input power protection device 600. As shown in FIG. 6B, the PN junction of the Zener diode 620 is closer to the top portion of the semiconductor 621 than the bottom portion of the semiconductor 621.

As shown in FIG. 6B, the Zener diode 620 is coupled directly to a ground terminal 606 via the metal plate 626. Although not shown in FIG. 6A or 6B, in some embodiments, the Zener diode 620 may be coupled to the ground terminal 606 via one or more conductors (e.g., one or more wires).

As shown in FIGS. 6A and 6B, the fuse 610, the Zener diode 620, the conductor 630, and the terminals (i.e., the input terminal 602, the output terminal 604, the ground terminal 606) are integrated into the input power protection device 600. Specifically, these components are disposed within a container 650 that includes a molding 652 formed around the components. In some embodiments, the container 650 and molding 652 can collectively define a package. In some embodiments, additional components, in addition to those mentioned above, can be included in the input power protection device 600. In some embodiments, additional components can be integrated into the input power protection device 600. In some embodiments, the container 650 can have a cover (e.g., a lid, a bottom portion) that is disposed over the components after the components have been disposed within at least a portion of the container 650. In some embodiments, one or more of the terminals may extend beyond the boundaries of the container 650.

Figure 8:
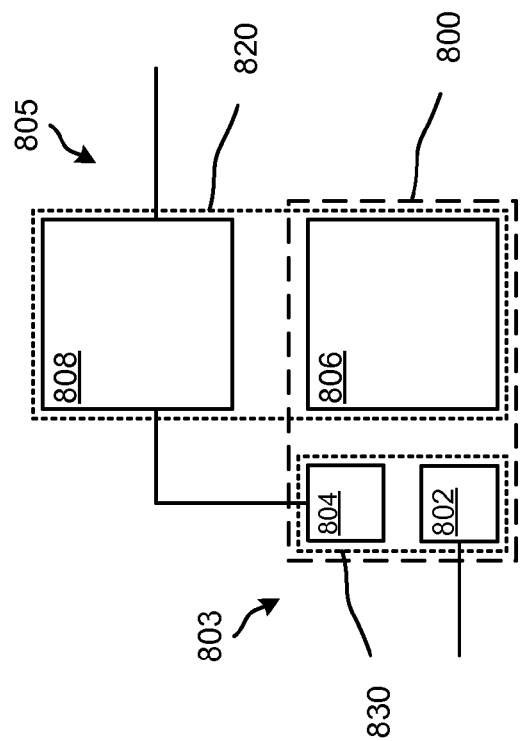
FIG. 8 is a block diagram that illustrates an overcurrent protection socket and an overvoltage protection socket.

As shown in FIG. 6B, each of the terminals is coupled to a pin that can be used to plug the input power protection device 600 into, for example, a printed circuit board (PCB). Specifically, the input terminal 602 is coupled to pin 612, the output terminal 604 is coupled to pin 614, and the ground terminal 606 is coupled to pin 616. An example of a sockets of a printed circuit board into which the input power protection device 600 can be inserted (e.g., plugged) is shown in FIG. 8. In some embodiments, the one or more of the terminals can be coupled to a different type of connector (other than pins) that can be used to couple the input power protection device 600 to a board such as a ball. In some embodiments, one or more of the terminals may not be coupled to pins (as shown) or balls, but can be, or can be coupled to, a pad that can be soldered to a board. In such embodiments, one or more of the pins may optionally be omitted.

Figure 7B:
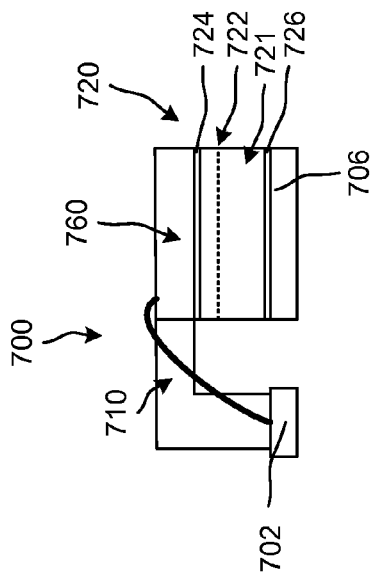
FIG. 7B is a block diagram that illustrates a side view of the components of the input power protection device shown in FIG. 7A.
Figure 7A:
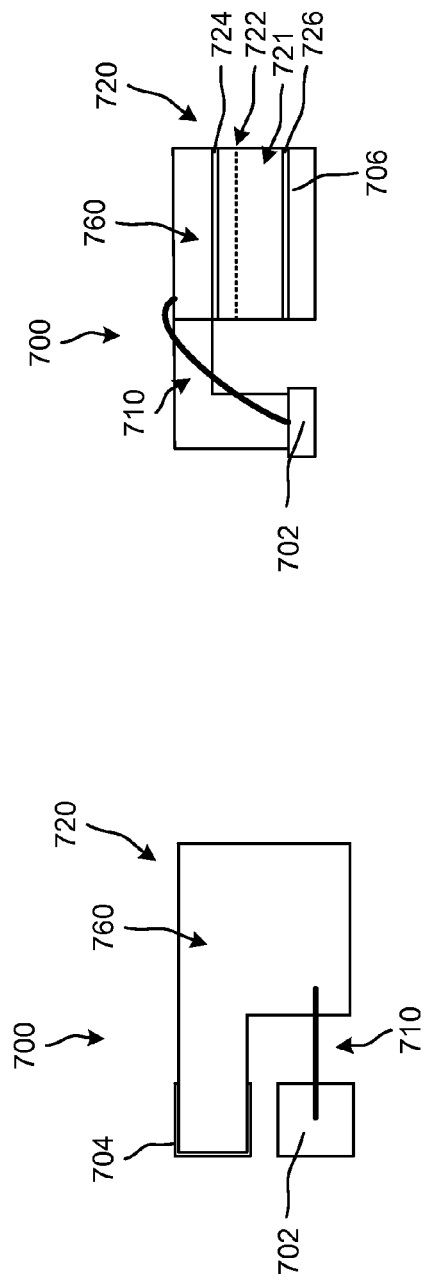
FIG. 7A is a block diagram that illustrates a top view of components of an input power protection device.

FIG. 7A is a block diagram that illustrates a top view of components of an input power protection device. FIG. 7B is a block diagram that illustrates a side view of the components of the input power protection device shown in FIG. 7A. The input power protection device 700 includes a fuse 710 that functions as an overcurrent protection portion and a Zener diode 720 that functions as an overvoltage protection portion. In this embodiment, the fuse 710 is defined by a wire that is coupled to (e.g., wire bonded to) an input terminal 702 and coupled to (e.g., wire bonded to) a metal plate 724 that is part of the Zener diode 720. In other words, the fuse 710 can be a wire bond fuse. In some embodiments, the fuse 710 can be any type of fuse (e.g., a narrow metal structure fuse, an on-diode fuse layer).

As shown in FIG. 7A, the Zener diode 720 can be coupled to an output terminal 704 of the input power protection device 700 via a conductive clip 760. In some embodiments, the conductive clip 760 can be made of any type of conductive material such as, for example, aluminum, gold, and/or so forth. In some embodiments, the conductive clip 760 can be made of the same material as the fuse 710.

In some embodiments, the conductive clip 760 can be configured (e.g., a geometry, a thermal mass, and/or a material type of the conductive clip 760 can be configured) so that the fuse 710 will fail open before the conductive clip 760 fails open in response to current flowing between the input terminal 702 and the output terminal 704 via the fuse 710 and the conductive clip 760. For example, in one such embodiment, the fuse 710 will fail open before the conductive clip 760 fails open because the cross-sectional area (and resistance) of the fuse 710 can be smaller than the collective cross-sectional area (and resistance) of the conductive clip 760.

In some embodiments, use of the conductive clip 760 can facilitate handling of relatively high pulses of energy because the conductive clip 760 can have a relatively large mass (e.g., large surface area) coupled to, for example, the Zener diode 720 and/or the output terminal 704. In some embodiments, the conductive clip 760 can have a relatively large mass that can function as a thermal sink (e.g., a thermal heat sink) for the Zener diode 720 and/or the output terminal 704. Thus, the Zener diode 720 can be a higher power component than if a conductor smaller than the conductive clip 760 were coupled to the Zener diode 720.

As shown in FIG. 7B, the Zener diode 720 includes a semiconductor 721 that has a PN junction 722. The metal plate 724 is disposed on a top portion of the semiconductor 721 and a metal plate 726 is disposed on the bottom portion of the semiconductor 721. In some embodiments, the metal plate 724 and/or the metal plate 726 can be defined by metal disposed on (e.g., sputtered on) the semiconductor 721 using semiconductor processing needs. In some embodiments, the metal plate 724 and/or the metal plate 726 may not cover the entire top portion or bottom portion of the semiconductor 721. Although not shown in FIG. 7B, the PN junction of the Zener diode 720 can be closer to the bottom portion of the semiconductor 721 than the top portion of the semiconductor 721.

As shown in FIG. 7B, the Zener diode 720 is coupled directly to a ground terminal 706 via the metal plate 726. Although not shown in FIG. 7A or 7B, in some embodiments, the Zener diode 720 may be coupled to the ground terminal 706 via one or more conductors (e.g., one or more wires).

Although not shown in FIG. 7A or FIG. 7B, the components of the input power protection device shown in FIGS. 7A and 7B can be integrated into a package similar to that shown in FIGS. 6A and 6B. In some embodiments, additional components, in addition to those mentioned above, can be included in the input power protection device. For instance, in other implementations, other arrangements and components may be used. For example, other types of conductive clips may be used, the PN junction of a Zener diode used as an overvoltage protection portion may be located closer to an opposite surface of a semiconductor material than as shown in FIG. 7 and/or other types of fuses may be used (such as fuse that are implemented in a silicon substrate, as some examples.

FIG. 8 is a block diagram that illustrates an overcurrent protection socket 803 and an overvoltage protection socket 805. The overcurrent protection socket 803 includes pad 802 and pad 804. The overvoltage protection socket 805 includes pad 806 and pad 808. In some embodiments, the overcurrent protection socket 803 and the overvoltage protection socket 805 can be standard sockets into which standard (e.g., standard size) discrete components may be inserted. Electrical connections between and from the pads (e.g. between pad 804 and pad 808) are shown in FIG. 8.

For example, a standard-size, discrete component overvoltage protection device, such as a Zener diode, can be inserted into socket 805 via pads 806 and 808. In some embodiments, the discrete component overvoltage protection device can be in an SMB package. A footprint of a standard-size, discrete component overvoltage protection device is shown as outline 820. Similarly, a standard-size, discrete component overcurrent protection device, such as a fuse, can be inserted into socket 803 via pads 802 and 804. In some embodiments, the discrete component overcurrent protection device can be in a 0402 package. A footprint of a standard-size, discrete component overcurrent protection device is shown as outline 830.

As shown in FIG. 8, an input power protection device (which integrates an overcurrent protection portion and an overvoltage protection portion) such as those described above can be used to replace separate discrete component overvoltage protection and overcurrent protection devices. A footprint of an input power protection device inserted into at least a portion of the overvoltage protection socket 805 and the overcurrent protection socket 803 is shown as outline 800. As shown in FIG. 8, because the input power protection device may be a three terminal device the input power protection device may not be inserted into at least a portion of the overvoltage protection socket 805 and/or the overcurrent protection socket 803. In the embodiment shown in FIG. 8, the input power protection device is not inserted into pad 808.

As illustrated by FIG. 8, an input power protection device can be configured to be inserted into standard sockets associated with discrete component overvoltage protection devices and/or overcurrent protection devices. Thus, the input power protection device can be configured to replace separate discrete component overvoltage protection devices and/or overcurrent protection devices.

Figure 9:
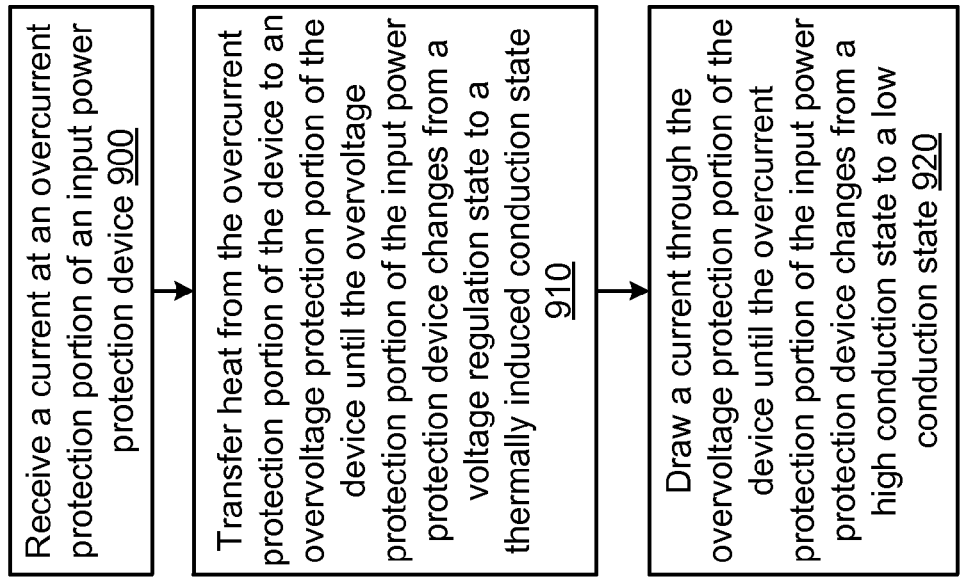
FIG. 9 is a flowchart that illustrates a method for using an input power protection device.

FIG. 9 is a flowchart that illustrates a method for using an input power protection device. In some embodiments, the input power protection device can be similar to, or the same as, any of the input power protection devices described herein.

A current is received at an overcurrent protection portion of an input power protection device (block 900). In some embodiments, the overcurrent protection portion of the input power protection device can be a fuse (e.g., a wire bond fuse, a fuse produced using semiconductor processing techniques) or other type of overcurrent protection device. In some embodiments, the current received at the overcurrent protection portion can be through the overcurrent protection portion and can be below a threshold current (e.g., rated current) of the overcurrent protection portion.

Heat from the overcurrent protection portion of the device is transferred to an overvoltage protection portion of the device until the overvoltage protection portion of the input power protection device changes from a voltage regulation state to a thermally-induced conduction state. (block 910). Depending on the particular embodiment, the thermally induced conduction state may include sinking current through a thermally-activated current sink, a thermally-activated current sink entering thermal runaway and/or a TVS diode failing short, as some examples. In some embodiments, the overvoltage protection portion of the input power protection device can be any type of transient voltage suppression device such as a Zener diode that is subject to thermal breakdown. In other embodiments, the overvoltage protection portion may include a thermally-activated current sink, as indicated above. Heat from the overcurrent protection portion can be transferred to the overvoltage protection portion (and vice versa) until a temperature of the overvoltage protection portion exceeds a threshold temperature (also can be referred to as a threshold breakdown temperature) and the overvoltage protection portion changes from the voltage regulation state to a thermally induced conduction state, or a thermally induced shorted state.

In some embodiments, the overcurrent protection portion may be integrated into (e.g., packaged within) the input power protection device with the overvoltage protection portion so that heat may be transferred between the overcurrent protection portion and the overvoltage protection portion. In other words, the overvoltage protection portion and the overcurrent protection portion may be integrated into a discrete component that can be included in, for example, a computing device. In some embodiments, the heat may be transferred via a molding injected between the overvoltage protection portion and the overcurrent protection portion.

In certain embodiments, once thermal breakdown occurs (or sufficient thermal conduction occurs), a current is drawn through the overvoltage protection portion of the device until the overcurrent protection portion of the device changes from a high conduction state to a low conduction state (e.g., fails open) (block 920). The current can be drawn through the overvoltage protection portion in response to the overvoltage protection portion changing from the voltage regulation state to the shorted state (e.g., failing short). The current drawn through the overvoltage protection portion can be drawn through the overcurrent protection portion of the input power protection device until the overcurrent protection portion changes from the high conduction state to the low conduction state (e.g., fails open). In some embodiments, if the overcurrent protection portion is a fuse, the fuse can melt and form an open circuit when the fuse changes from the high conduction state to the low conduction state (e.g., fails open).

FIG. 10A is a side view of an input power protection device 1000, according to an embodiment. As shown in FIG. 10A, the input power protection device 1000 is implemented as a chip-scale package (CSP) device. In some embodiments, the chip-scale package device can be referred to as a chip-size packaging device. In some embodiments, the input power protection device 1000 is less than or equal to 1.5 times the size of the die of an overvoltage protection portion (e.g., a Zener diode) of the input power protection device 1000. In some embodiments, the input power protection device 1000 is greater than 1.5 times the size of the die of an overvoltage protection portion (e.g., a Zener diode) of the input power protection device 1000. As shown in FIG. 10A, the input power protection device 1000 has pads or balls (e.g., a ball grid array (BGA)) 1022 that can be used to couple the input power protection device 1000 to for example, a board (e.g., a PCB). In some embodiments, the input power protection device 1000 can be implemented as a wafer level chip scale package (WL-CSP). Although not shown in FIG. 10A, an input power protection device, such as those described here in, can be implemented as a CSP, or multiple CSPs, such as that show in FIG. 10A.

FIG. 10B is a top view of the input power protection device 1000 shown in FIG. 10A, according to an embodiment. As shown in FIG. 10B the input power protection device 1000 has four pads 1022. In some embodiments, the input power protection device 1000 can have more or less pads 1022 than are shown in FIG. 10B. In some embodiments, one or more of the pads 1022 can include, or can be, an input terminal, an output terminal, and/or a ground terminal.

Any of the embodiments described herein can be implemented in a CSP device. For example, the input power protection device shown in FIGS. 7A and 7B (as well as the other embodiments described herein) can be implemented as a CSP device. In such embodiments, wire bonds, clips, and/or wire routing can be replaced with balls and/or can be implemented using silicon processing structures.

FIG. 11A is a side view of another input power protection device 1100, according to an embodiment. As shown in FIG. 11A, the input power protection device 1100 is implemented as a CSP device. As shown in FIG. 11A, the input power protection device 1100 has pads or balls (e.g., a ball grid array (BGA)) 1122 that can be used to couple the input power protection device 1100 to for example, a board (e.g., a PCB). In some embodiments, the input power protection device 1100 can be implemented as a wafer level chip scale package (WL-CSP).

In this embodiment, the input power protection device 1100 includes an overcurrent protection portion 1110 (e.g., a fuse) and an overvoltage protection portion 1120 (e.g., a Zener diode, a TVS device). In this embodiment, an insulation layer 1124 is disposed between the overcurrent protection portion 1110 and the overvoltage protection portion 1120. In some embodiments, the overcurrent protection portion 1110 can be an embedded thin-film metal fuse or polysilicon electronic fuse (e-fuse) structure. In some embodiments, the overcurrent protection portion 1110 can be, or can include, for example, a tungsten metal deposited on a polysilicon substrate.

FIG. 11B is a top view of the input power protection device 1100 shown in FIG. 11A, according to an embodiment. As shown in FIG. 11B the input power protection device 1100 has four pads 1122. In some embodiments, the input power protection device 1100 can have more or less pads 1122 than are shown in FIG. 11B. In some embodiments, one or more of the pads 1122 can include, or can be, an input terminal, an output terminal, and/or a ground terminal. In this embodiment, the overcurrent protection portion 1110 includes a fuse 1112 portion.

Figure 12B:
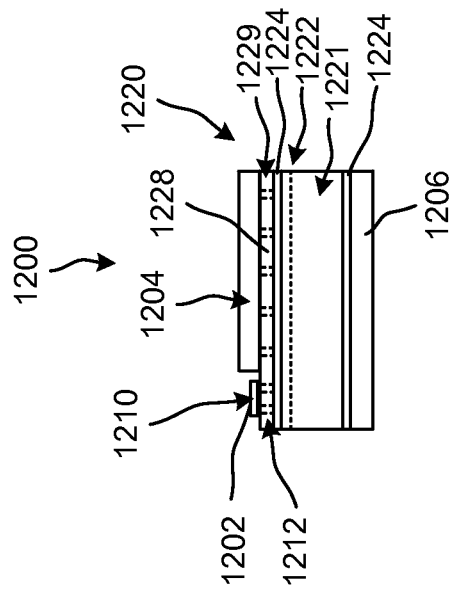
FIG. 12B is a block diagram that illustrates a side view of the components of the input power protection device shown in FIG. 12A.
Figure 12A:
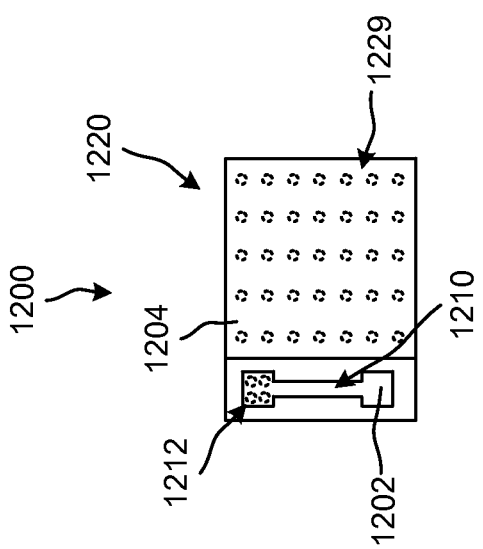
FIG. 12A is yet another block diagram that illustrates a top view of components of an input power protection device, according to an embodiment.

FIG. 12A is yet another block diagram that illustrates a top view of components of an input power protection device 1200. FIG. 12B is a block diagram that illustrates a side view of the components of the input power protection device 1200 shown in FIG. 12A. The input power protection device 1200 includes a fuse 1210 (in this case a dog-bone shaped fuse) that functions as an overcurrent protection portion and a Zener diode 1220 that functions as an overvoltage protection portion. As shown in FIG. 12A, the Zener diode 1220 can be coupled to an output terminal 1204 of the input power protection device 1200 through the vias 1229 (through an insulator 1228 shown in FIG. 12B). As shown in FIG. 12B, a first portion of the fuse 1210 can function as, or can be coupled to (e.g., electrically coupled to) an input terminal 1202 (using a conductive clip that is not shown), and a second portion of the fuse 1210 is coupled to (e.g., electrically coupled to) the output terminal 1204 through the vias 1212 (through the insulator 1228 shown in FIG. 12B).

As shown in FIG. 12B, the Zener diode 1220 includes a semiconductor 1221 that has a PN junction 1222 and metal plates 1224 that are disposed on a top portion and on a bottom portion of the semiconductor 1221. In some embodiments, the PN junction 1222 and/or the metal plates 1224 can be similar to those described above. As shown in FIG. 12B, the Zener diode 1220 is coupled directly to a ground terminal 1206 via the metal plate 1224 on the bottom portion of the semiconductor 1221.

In this embodiment, the fuse 1210 is defined by a process layer (e.g., a metal layer) that is disposed on a semiconductor 1221 of the Zener diode 1220. In some embodiments, the fuse 1210 and/or vias can be produced using semiconductor processing techniques. For example, in some embodiments, the fuse 1210 can be defined by a metallic material that is deposited on the semiconductor 1221 of the Zener diode 1220 using a sputtering technique. In other words, the fuse 1210 and the Zener diode 1220 can both be formed within a common silicon substrate using semiconductor processing techniques. The output terminal 1204 and the fuse 1210 can be insulated from the semiconductor 1221 and the metal plate 1224 on the top portion of the semiconductor 1221 by the insulator 1228.

Although not shown in FIG. 12A or FIG. 12B, in some embodiments, the output terminal 1204 (or solder and/or a molding that can function as an output terminal) can be directly coupled to the metal plate 1224 on the top portion of the semiconductor 1221 and/or can be directly coupled to the semiconductor 1221. In such embodiments, the insulator 1228 may not be disposed between the output terminal 1204 and the semiconductor 1221 (and/or metal plate 1224 above the semiconductor 1221). In such embodiments, at least a portion of the insulator 1228 may be etched away before the output terminal 1204 is disposed on at least a portion of the metal plate 1224 and/or on at least a portion of the semiconductor 1221.

Although not shown in FIG. 12A or 12B, in some embodiments, the input power protection device 1200 may be capped with an insulative (e.g., electrically insulative, thermally insulative) material (or coating) and/or a material (or coating) that provides structural support, to optimize (e.g., modify) fuse performance, and/or to shield the fuse from interactions with the outside environment. For example, the input power protection device 1200 may be capped (or coated) with a glass material, a polysilicon material, and/or so forth.

Although not shown in FIG. 12A or FIG. 12B, the components of the input power protection device shown in FIGS. 12A and 12B can be integrated into a package similar to that shown in FIGS. 6A and 6B. In some embodiments, additional components, in addition to those mentioned above, can be included in the input power protection device. In some embodiments, the input power protection device 1200 shown in FIGS. 12A and 12B can be implemented as a CSP device.

FIG. 13A is a more detailed schematic of FIG. 2, showing thermal characteristics of an overvoltage protection device implemented including a thermally-activated current sink 1330 as a unique element. As shown in FIG. 13A, the input power protection device 1300 includes similar elements as the input power protection device 200 shown in FIG. 2. For example, the input power protection device 1300 includes a fuse 1310. In like fashion as the fuse 210, the fuse device 1310 functions as an overcurrent protection portion (device) of the input power protection device 1300. In some embodiments, the fuse 1310 can be formed of any type of material (or combination thereof) such as, for example, aluminum, tin, copper, lead, brass, bronze, nichrome, polysilicon and/or so forth. The fuse may be a reflowable thermal fuse, a pulse-resilient fuse, or a low-resistance, pulse-resilient fuse, as some examples.

The input power protection device 1300 also includes a Zener diode 1320 (e.g., a type of TVS diode), which may function as an overvoltage protection portion of the input power protection device 1300, in fashion similar to other embodiments described herein. In some implementations, the Zener diode 1320 can be a semiconductor device formed using a PN junction (which is formed with or associated with a p-type semiconductor and an n-type semiconductor) in a number of semiconductor materials such as, for example, silicon (e.g., a doped silicon), gallium arsenide, germanium, silicon carbide, and/or so forth.

In certain embodiments, the Zener diode 1320 can be formed in a common substrate with the other elements of the input power protection device 1300, while in other embodiments, discrete components may be used. Such discrete components may be implemented in sockets, such as the sockets described above with respect to FIG. 8. Of course, other socket configurations may be used, as appropriate for the particular embodiment. Also, other arrangements or configurations of the elements of the input power protection device 1300 are possible. Further, while this embodiment (FIG. 13A), as with many of the embodiments described herein, is discussed in the context of a Zener diode, a number of others types of overvoltage protection devices may be used along with, or instead of, the Zener diode 1320. For example, the overvoltage protection portion of the input power protection device 1300 could be any type of TVS device.

As shown in FIG. 13A, in addition to the elements of the input power protection device 1300 discussed above that are similar to the elements of the input power protection device 200, the input power protection device 1300 includes the thermally-activated current sink 1330. Such a thermally-activated current sink may be implemented as a dedicated element that is configured to enhance and/or better control a thermal response of a TVS diode as part of an overvoltage protection device (portion) of an input protection circuit, such as those described herein.

As illustrated in FIG. 13A, the thermally-activated current sink 1330 is coupled in parallel with the Zener diode 1320. Depending on the particular implementation, the thermally-activated current sink 1330 and the Zener diode 1320 may be have a relatively strong thermal dependence on one another (e.g., when implemented in a common silicon substrate). For example, the thermally-activated current sink 1330 and the Zener diode 1320 may each have a strong thermal dependence not only on their respective current, but also on current that is conducted through the other device.

In other embodiments the thermally-activated current sink 1330 and the Zener diode 1320 may be have a relatively weak thermal dependence on one another (e.g., when implemented using separate discrete components). In such embodiments, the thermally-activated current sink 1330 may be used to detect unsafe temperatures conditions, such as may occur on a printed circuit board on which the input power protection device 1330 is implemented (e.g., as a result of power dissipation by other components on the printed circuit board), or unsafe temperature conditions within the input power protection device 1330, for example. For instance the thermally-activated current sink 1330 may be configured to detect unsafe temperature conditions that may occur as a result of localized levels of power dissipation by other components on a printed circuit board, where heat associated with that power dissipation is conductively (or convectively) transferred to the thermally-activated current sink 1330.

As another example, the thermally-activated current sink 1330 may be configured to detect unsafe temperature conditions that may occur as a result of heating in the fuse 1310, e.g., as a result of current conditions such as those described above with respect to FIG. 3A (a persistent current below a rated trip current of the fuse 1310). In such situations, the thermally-activated current sink 1330 may be configured to initiate a self-induced thermal runaway mode in response to unsafe temperature conditions. For instance, a pre-determined threshold temperature may be defined such that as a result of the input power protection device (e.g., the thermally-activated current sink 1330) reaching (or exceeding) the pre-determined threshold temperature, the thermally-activated-current sink 1330 may initiate thermal runaway causing a rapid increase in current through the fuse, and heat generation in the system, resulting in the fuse transitioning from a low resistance to high resistance state. In other words, the threshold temperature can be defined so that an unsafe temperature (e.g., of the downstream circuit(s)) can be avoided using the input power protection device 1300 thermally-activated current sink 1330, such as in the various approaches described herein.

In such approaches, the thermally-activated current sink 1330, when operating at a safe temperature (e.g., below a threshold temperature), may operate in a high impedance state and source (or draw) only a small amount of current (e.g., on the order of tens of milliamps, on the order of a leakage current). However, when an ambient temperature of the thermally-activated current sink 1330 increases (e.g., above a threshold temperature), the thermally-activated current sink 1330 may initiate a self-induced thermal runway mode and, as a result, switch from operating in a high impedance state to operating in a low impedance state, effectively providing a short to ground and, as a result, source a relatively large amount of current (e.g., on the order of 100 mA to tens of amps). This thermal runaway current would then be pulled through the fuse 1310 and, as a result, may cause the fuse 1310 to blow open in response to the unsafe temperature condition, even if a current through the fuse, prior to the thermally-activated current sink 1330 initiating self-induced thermal runway, is below a rated trip current for the fuse 1310.

In such approaches, the temperature (threshold temperature) at which thermal runaway is initiated in the thermally-activated current sink 1330 may depend on the particular implementation. The threshold temperature may depend on one or more implementation factors, such as the particular current sink that is used, an amount of thermal coupling/resistance between the current sink and other elements of an electronic system in which the input power protection device 1300 is implemented and/or the amount of power dissipated by other elements of such an electronic system, as well as a number of other possible factors.

In the embodiment of FIG. 13A, as a result of the fuse 1310 blowing open (as discussed above), power may no longer be supplied to a component (or components) (e.g., circuit load) coupled with the input power protection device 1330 that were causing the unsafe temperature condition. This shunting may prevent damage (or further damage) to an associated load circuit and/or may prevent a printed circuit board fire from occurring due to the unsafe temperature condition being allowed to persist, or worsen, as the fuse blowing open would eliminate the cause of the unsafe temperature condition. Of course, other undesirable effects of such an unsafe temperature condition persisting, other than those specifically described herein, may also be avoided.

Figure 17:
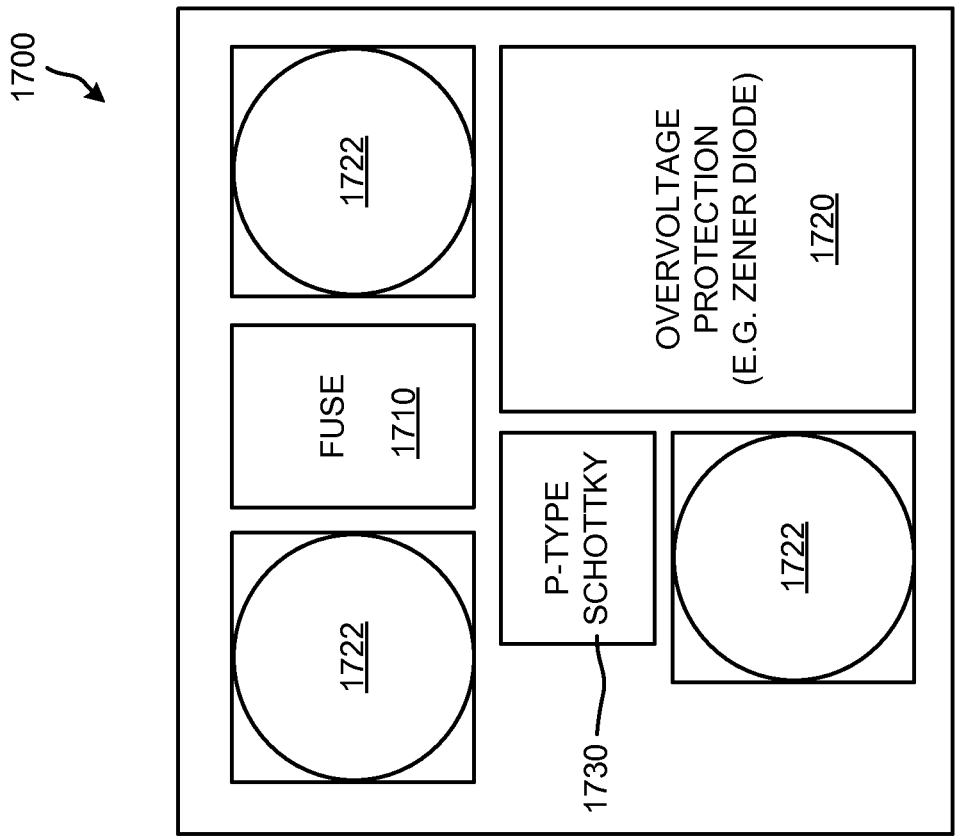
FIG. 17 is a block diagram that illustrates a layout of an input power protection device, according to an embodiment.

As shown in FIG. 13A (by arrows 1335a and 1335b), the fuse 1310, the thermally-activated current sink 1330 and/or the Zener diode 1320 may be configured so that they are thermally coupled with one another in order to affect a positive temperature feedback between the separate devices. In other words, the fuse 1310, the thermally-activated current sink 1330 and/or the Zener diode 1320 may be arranged to form (or define) a positive thermal feedback loop, or system. Such thermal feedback between the fuse 1310, the thermally-activated current sink 1330 and/or the Zener diode 1320 may be achieved in a number of configurations. As one example, the fuse 1310, the thermally-activated current sink 1330 and/or the Zener diode 1320 may be implemented in a single silicon substrate in close physical proximity to one another (e.g., such as illustrated in FIG. 17). As another example, the fuse 1310, the thermally-activated current sink 1330 and/or the Zener diode 1320 may be discrete components that may be thermally coupled with each other using an appropriate thermally conductive and electrically insulative material, such as diamond, undoped silicon, or silicon oxides, for example.

As shown in FIG. 13A (and similarly in FIG. 13B), the fuse 1310, the Zener diode 1320 and the thermally-activated current sink 1330 are integrated into the input power protection device 1300 so that the input power protection device 1300 functions as a single integrated component. In other words, the fuse 1310, the Zener diode 1320 and the thermally-activated current sink 1330 can be packaged into the input power protection device 1300 (such as in a molded package or a CSP, as described herein) so that the input power protection device 1300 functions as a standalone component.

Similar to the input power protection device 200 shown in FIG. 2, because the fuse 1310, the Zener diode 1320 and the thermally-activated current sink 1330 are integrated into the input power protection device 1300, the input power protection device 1300 includes three terminals. As shown in FIG. 13A (and 13B), the three terminals of the input power protection device 1300 are a power-supply input terminal 1302, a power-supply output terminal 1304, and a ground terminal 1306. As shown in FIG. 13A (and FIG. 13B), the power-supply input terminal 1302 is coupled to (e.g., electrically coupled to) one end (e.g., a first end) the fuse 1310. The Zener diode 1320 and the thermally-activated current sink are coupled to (e.g., electrically coupled to) the other end (e.g., a second end) of the fuse 1310, which is also coupled to (e.g., electrically coupled to) the power-supply output terminal 1304. Thus, one end the fuse 1210, the Zener diode 1320 and the thermally-activated current sink are all coupled to the power-supply output terminal 1304 and function as a single node. The Zener diode 1320 and the thermally-activated current sink 1330 are also coupled to the ground terminal 1306.

Because the input power protection device 1300 includes a three terminal architecture, the fuse 1310 can fail (blow) open and, as a result, interrupt current (power) to the Zener diode 1320, the thermally-activated current sink 1330 and a downstream system (e.g., a circuit load) coupled to the input power protection device 1300 via the output terminal 1304. In some embodiments, the fuse 1310 can fail open when the fuse 1310 melts to produce an open circuit. In some embodiments, the fuse 1310 can fail open in response to a downstream overcurrent event, an overvoltage event, and/or a thermal event, such as those described herein.

FIG. 13B illustrates an example implementation of the input power protection circuit 1300 where an additional structure is added specifically to enhance the current sink function of the overvoltage protection device. In the embodiment illustrated in FIG. 13B, the thermally-activated current sink 1330 is enhanced with the addition of a thermally leaky Schottky diode structure 1331. Depending on the particular situation, the Schottky diode 1331 may be a p-type Schottky diode or an n-type Schottky diode. In other implementations, the thermally-activated current sink 1330 may be enhanced or implemented in other configurations, such as using a conventional PN junction diode, a resistor with a negative temperature coefficient, a bipolar device, a field effect transistor, or an active current sink circuit, as some examples. The other elements of the input power protection device 1300 illustrated in FIG. 13B may implemented in like fashion as discussed above with respect to FIG. 13A. Accordingly, for purposes of brevity and clarity, those elements are not described again in detail with respect to FIG. 13B.

Figure 14:
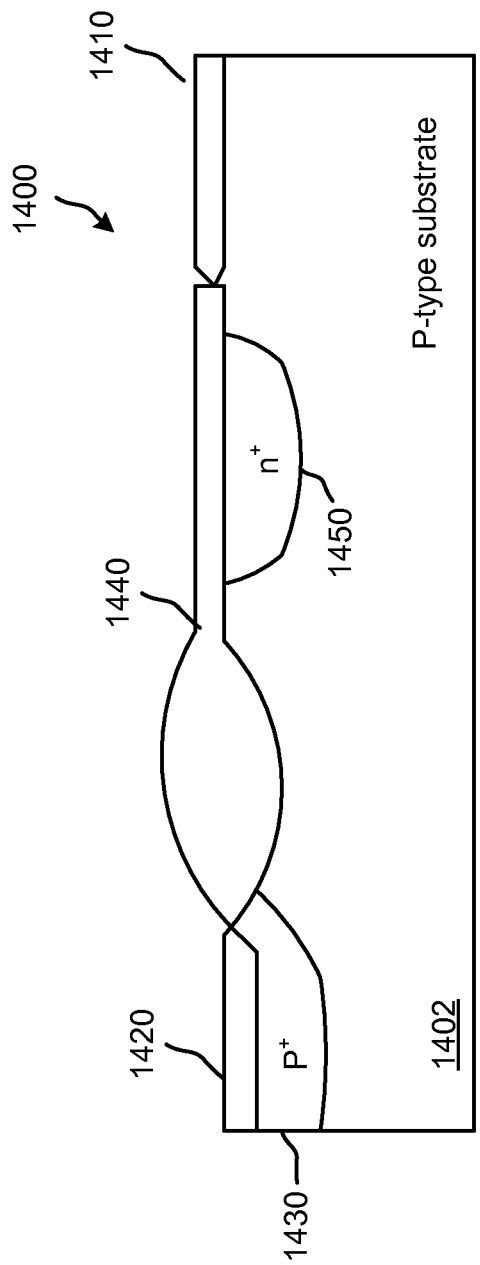
FIG. 14 is a cross-sectional diagram that illustrates a p-type Schottky diode that may be used to implement a thermally-activated current sink, according to an embodiment.

FIG. 14 is a cross-sectional diagram that illustrates a p-type Schottky diode 1400 that may be used to implement a thermally-activated current sink, such as the thermally-activated current sink 1330 (or the Schottky diode 1331) in the embodiments illustrated in FIGS. 13A and 13B. As shown in FIG. 14, the p-type Schottky diode 1400 includes a p-type semiconductor substrate 1402. Depending on the specific implementation, the other elements of an input power protection device (e.g., the input power protection device 1300) may also be implemented in the substrate 1402 along with the p-type Schottky diode 1400.

The p-type Schottky diode 1400 shown in FIG. 14 also includes a cathode 1410 and an anode 1420. In an example embodiment, the cathode 1410 and the anode 1420 may be formed from cobalt-silicide (CoSi). In such an approach, the work function between the CoSi anode 1410 and the properly doped p-type substrate 1402 can be used to create a Schottky junction with appropriate leakage and thermal characteristics.

As also shown in FIG. 14, the p-type Schottky diode 1400 further includes a heavily doped p+ region 1430 under the cathode 1420. While an energy barrier exists between the CoSi cathode 1420 and the p-type substrate 1402, the heavily doped p+ region 1430 will allow for carrier tunneling, thus forming an ohmic contact for the cathode 1420 of the p-type Schottky diode 1400. Further, the p-type Schottky diode 1400 includes a field oxide region 1440, which insulates the p-type Schottky diode 1400 from further processing steps.

In other implementations, an n-type Schottky diode, or other device(s) could be formed to implement a thermally-activated current sink. However, use of the p-type Schottky diode 1400 may be advantageous, in semiconductor processes that include p-type substrates and CoSi as part of a process (e.g., a standard process). In such instances, the p-type Schottky diode 1400 may be formed without any additional processing operations needed, such as forming an n-well, as would be required to implement an n-type Schottky diode or other devices requiring an n-type substrate.

Figures 15, 16:
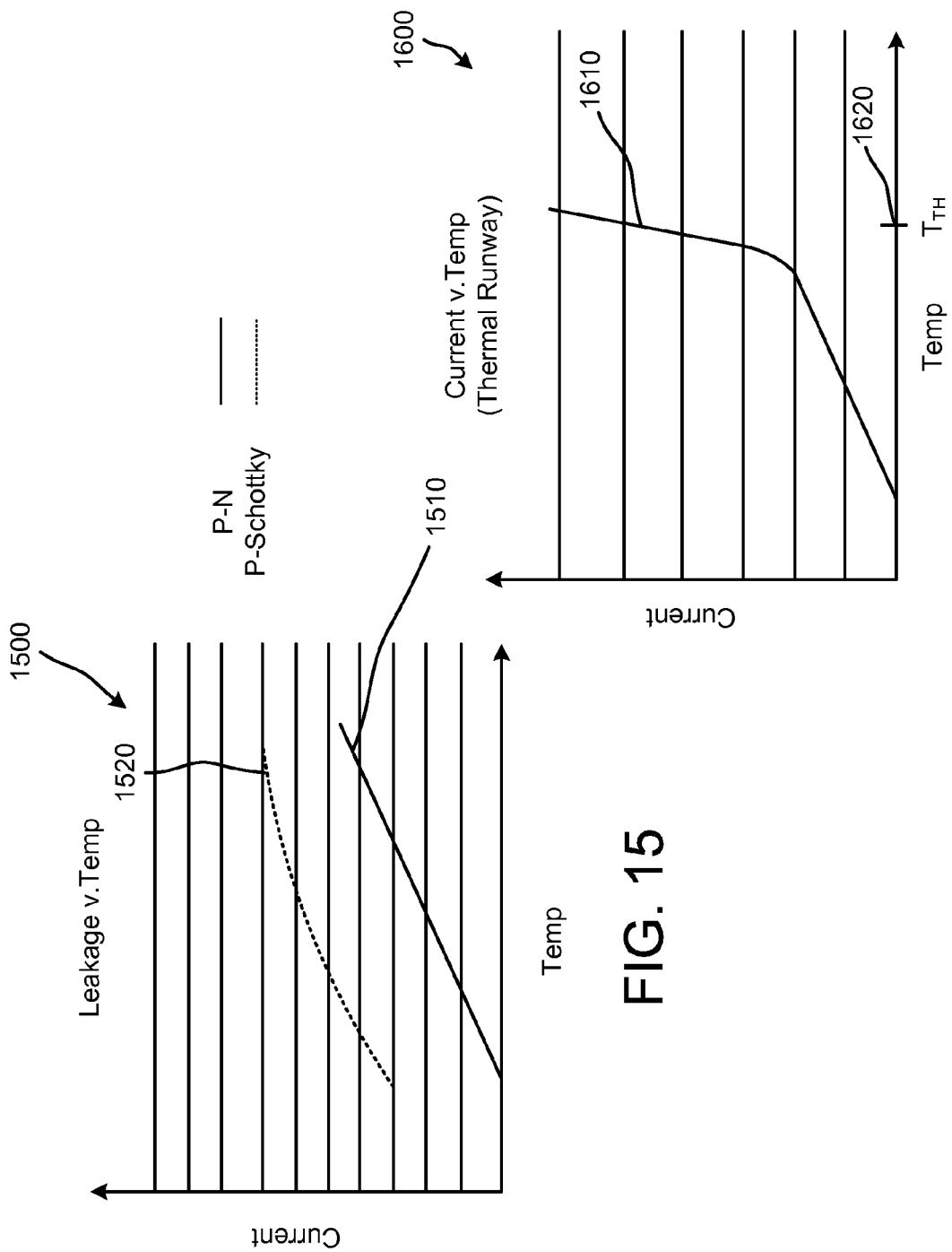
FIG. 15 is a graph that illustrates a comparison of leakage current versus temperature for a standard PN junction diode and a p-type Schottky diode, such as the p-type Schottky diode illustrated in FIG. 14.
FIG. 16 is a graph that illustrates current versus temperature for a thermally-activated current sink (e.g., thermal shunt), according to an embodiment.

FIG. 15 is a graph 1500 that illustrates a comparison of leakage current versus temperature for a standard TVS PN junction diode and a p-type Schottky diode, such as the p-type Schottky diode 1400 illustrated in FIG. 14. The comparison shown in FIG. 15 illustrates leakage currents for diodes (PN diode and p-type Schottky diode) of the same area. In FIG. 15, current is shown on the vertical axis using a log scale.

In the graph 1500, leakage current versus temperature for the conventional PN TVS diode is shown by the line 1510, while leakage current versus temperature for the p-type Schottky diode is shown by line 1520. The specific leakage currents and temperatures are not shown in the graph 1500 and will vary based on the specific implementation. However, as may be seen in FIG. 15, the leakage current for the p-type Schottky diode at a given temperature is several orders of magnitude greater than the leakage current for the PN junction diode. Accordingly, depending on the particular implementation, using a p-type Schottky diode, due to its leakage current versus temperature behavior, may provide enhanced thermal sinking performance characteristics to more readily detect unsafe temperature conditions as compared to other types of devices used to implement a thermally-activated current sink.

FIG. 16 is a graph 1610 that illustrates current versus temperature for a thermally-activated current sink (e.g., a thermal shunt), according to an example embodiment. As with FIG. 15, current in FIG. 16 is shown on the vertical axis using a log scale. The current relationship shown in FIG. 16 is given by way of example and may represent a number of different thermally-activated current sinks, such as those described herein.

In the graph 1600, a current versus temperature relationship for a thermally-activated current sink (e.g., thermal shunt), such as the thermally-activated current sink 1330 (shown in FIG. 13A), is shown as curve 1610. As illustrated in FIG. 16, the thermally-activated current sink initiates a self-induced thermal runaway at a threshold temperature $T_{TH}$ 1620. In this situation, when thermal runaway is initiated, the thermally-activated current sink (e.g., thermal shunt) changes from operating in a high impedance mode (drawing relatively little current) to operating in a low impedance mode (drawing relatively large amounts of current). Once the thermally-activated current sink initiates thermal runaway, the current pulled through a fuse in an associated input power protection device, such as the input power connection device 1300, by the thermally-activated current sink may cause the fuse to fail (blow) open. In this situation, once the fuse of a corresponding input power protection device fails open, the current in the thermally-activated current sink would drop to zero or relatively close to zero as the fuse would be changed from a high-conduction state to a low-conduction state, thus preventing further unsafe temperature conditions, such as possible printed circuit board fires, for example. In certain embodiments, thermal runaway may not be required to blow or "crowbar" a fuse of an input protection device, such as the fuse 1310. For instance, in the implementation shown in FIG. 13A, leakage current through the current sink 1330 may increase the effective fuse current, as well as generate heat in the device 1300, where the generate heat and/or increased current may further derate the fuse and cause the fuse to blow open before thermal runaway occurs in the current sink 1330.

FIG. 17 is a block diagram that illustrates a layout of an input power protection device 1700, according to an embodiment. The layout of the input power protection device 1700 may be used implement the input power protection device 1300 shown in FIG. 13. As illustrated in FIG. 17, the input power protection device 1700 may be implemented as a CSP device, such as previously described with respect to FIGS. 10 and 11. The input power protection device 1700 includes a fuse 1710, an overvoltage protection device (e.g., Zener diode) 1720 and a p-type Schottky diode 1730, where the p-type Schottky diode is used to implement an enhanced thermally-activated current sink, such as described herein. Relative thermal position of the thermally-activated current sink as compared to the fuse or cooler heat sinks can be controlled to change the thermal response of the device.

The input power protection device 1700 also includes pads or balls 1722 that can be used to couple the input power protection device 1700 to, for example, a printed circuit board. In certain embodiments, the input power protection device 1700 can be implemented as a wafer-level chip scale package, such as previously described with respect to FIG. 10. Such implementations may allow for more efficient and predictable thermal interaction between the input power protection device 1700 and a circuit board on which it is implemented, as compared to input power protection devices that are implemented in molded packages, as such packages may have significant thermal resistances with large variations in their thermal resistance.

Figures 18, 19:
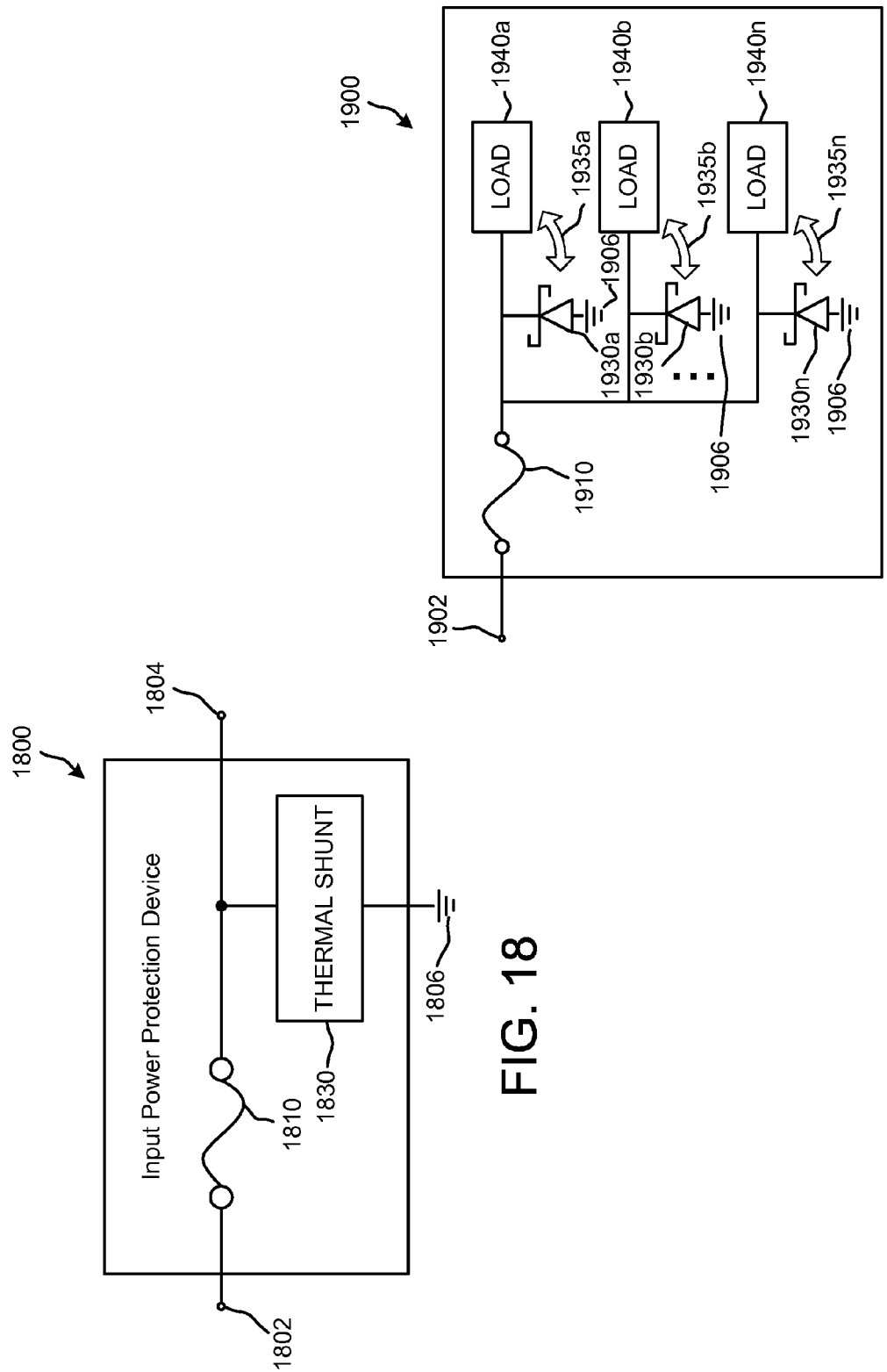
FIG. 18 is a block diagram that illustrates yet another input power protection device, according to an embodiment.
FIG. 19 is a schematic that illustrates a printed circuit board that includes an input power protection device (circuit), such as illustrated in FIG. 18, according to an embodiment.

FIG. 18 is a block diagram that illustrates yet another input power protection device 1800, according to an embodiment. As shown in FIG. 18, the input power protection device 1800, similar to the input power protection devices 200 and 1300 (which are shown above), includes a power-supply input terminal 1802, a power-supply output terminal 1804 and a ground terminal 1806. The input power protection device 1800 also includes a fuse 1810 and a thermal shunt 1830. In an example embodiment, the thermal shunt 1830 may be implemented using a thermally-activated current sink, such as those described herein. As compared to the input power protection devices 200 and 1300, the input power protection device 1800 does not include an overvoltage protection element, e.g., a Zener diode. Accordingly, the input power protection device 1800 may be used to protect downstream circuit load, such as an electronic circuit from unsafe temperature conditions, such as those that have been previously described, where overvoltage protection is not required, or is provided in another manner (e.g., by a separate overvoltage protection circuit).

The input power protection device 1800 may be implemented using similar techniques to those described above with respect to other embodiments. For instance, the input power protection device 1800 may be implemented in a single silicon substrate and/or may be implemented as a CSP (WL-CSP) device, as some examples.

In like fashion as was discussed with respect to the input power protection device 1300, the fuse 1810 and the thermal shunt 1830 may be configured so as to be thermally coupled with each other, in order to affect a positive thermal feedback interaction between them, or so as to provide for a positive thermal feedback system between the fuse 1810 and the thermal shunt 1830. For instance, the fuse 1810 and thermal shunt 1830 may be integrated into a single input power protection device 1800, which may be implemented, for example, and a common silicon substrate.

In other implementations, the fuse 1810 and the thermal shunt 1830 may be implemented as separate, discrete devices, such as in the embodiments described below with respect to FIGS. 19A and 19B. In other embodiments, a thermally conductive material could be used to thermally couple such discrete devices. In certain embodiments, multiple thermal shunts 1830 may be coupled to the power-supply output terminal 1804 in parallel with each other. In such approaches, the thermal shunt(s) 1830 may be thermally coupled with other elements of an electronic system in which the input power protection device 1800 is implemented, such as on a printed circuit board. In such approaches, the thermal shunts 1830 may be used to detect localized unsafe temperature conditions on the printed circuit board.

In similar fashion as was described above with respect to the thermally-activated current sink 1330 of FIG. 13A, the thermal shunt 1830 may initiate self-induced thermal runaway at a specific threshold temperature. It will be appreciated that the particular threshold temperature for a given implementation will vary based on the specific design characteristics and devices used. In similar fashion as was described with respect to the fuse 1310 and the thermally-activated current sink 1330 of the input power protection device 1300, the thermal shunt 1830 initiating thermal runaway will pull a large amount of current through the fuse 1810, which may cause the fuse 1810 to blow open in response to a given over-temperature condition that was causing (or contributing to) the thermal runaway. As a result of the fuse 1810 blowing open, the given over-temperature condition may be eliminated or resolved, thus preventing further associated issues, such as a printed circuit board fire, for example.

FIG. 19 is a schematic that illustrates a printed circuit board 1900 that includes an input power protection device (circuit), such as the input power protection device 1800 illustrated in FIG. 18 implemented using multiple thermal shunts 1830, according to an embodiment. As shown in FIG. 19, the printed circuit board 1900 includes a power-supply input terminal 1902, a ground terminal 1906, a fuse 1910, p-type Schottky diodes 1930a-1930n and circuit loads 1940a-1940n.

In such an approach, the p-type Schottky diodes 1930a-1930n may be physically dispersed across the circuit board 1900, e.g., in close physical proximity to their corresponding circuit loads 1940a-1940n, so as to affect (or set up) respective positive thermal feedback systems with their corresponding circuit loads 1940a-1940n (as indicated by the arrows 1935a-1935n). In this arrangement, each of the p-type Schottky diodes 1930a-1930n may be used to detect localized unsafe temperature conditions associated with their corresponding circuit loads, 1940a-1940n.

If any of the p-type Schottky diodes 1930a-1930n were to initiate self-induced thermal runaway as a result of a localized unsafe temperature condition (e.g., above a threshold temperature), that diode would pull large amounts of current through the, causing the fuse 1910 to blow open and thus prevent any further issues from the detected unsafe temperature condition, e.g., such as a printed circuit board fire or damage (or further damage) to one or more of the circuit loads 1940a-1940n.

Figure 20:
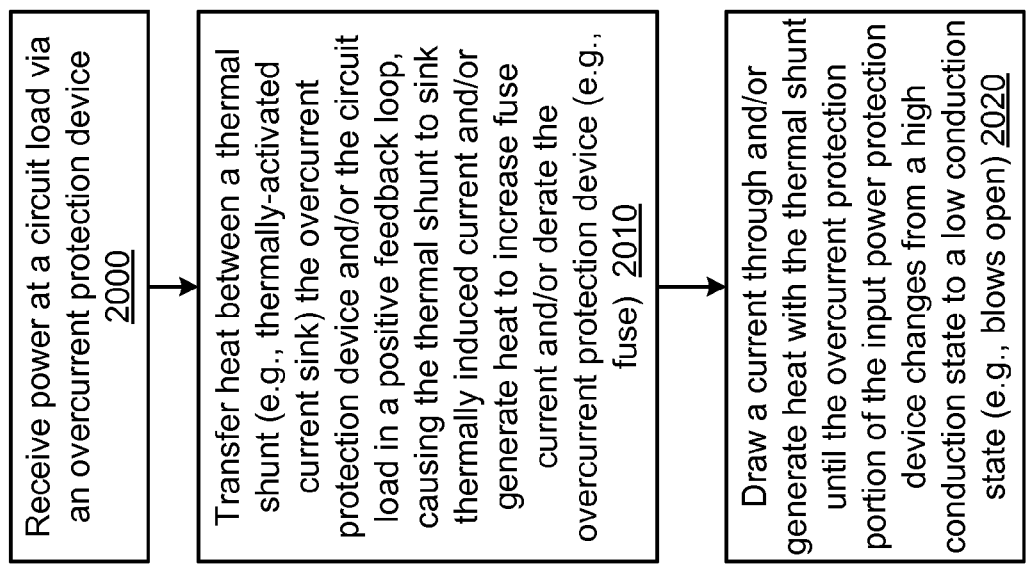
FIG. 20 is a flowchart that illustrates a method for using an input power protection device, according to an embodiment.

FIG. 20 is a flowchart that illustrates a method 2000 for using an input power protection device, according to an embodiment. In some embodiments, the input power protection device can be similar to, or the same as, for example, the input power protection devices 1300, 1700 or 1800.

Power is received at a circuit load via an overcurrent protection device (block 2000). In some embodiments, the overcurrent protection portion of the input power protection device can be a fuse (e.g., a wire bond fuse, a fuse produced using semiconductor processing techniques) or other type of overcurrent protection device, such as those described herein.

Heat is transferred between a thermal shunt (e.g., a thermally-activated current sink), the overcurrent protection device (e.g., a fuse) and/or the circuit load in a positive feedback loop, causing the thermal shunt to shunt (sink) current to ground, thus generating additional heat and/or increasing the fuse current, which may derate the fuse (block 2010). In other embodiments, heat may also be transferred (in a positive feedback loop) between the overcurrent protection device, the thermal shunt and an overvoltage protection device (e.g., a Zener diode). In such approaches, the associated positive thermal feedback loops may cause the current of the thermal shunt to increase, thus causing additional (thermally-induced) current in the thermal shunt, the overcurrent protection device and/or the overvoltage protection device. This additional current may then cause additional heating, which in turn may cause additional positive thermal feedback. This process may ultimately result in the thermal shunt initiating thermal runaway and changing to a low impedance operating state, such as previously described.

Once thermal current flow becomes significant in the thermal shunt, this current is drawn through the overcurrent protection device (fuse) of the input power protection device until the overcurrent protection device changes from a high conduction state to a low conduction state (e.g., fails open) (block 2020). For instance, in one embodiment, current can be drawn through the thermal shunt and the overcurrent protection device due to the self-induced thermal runaway until the overcurrent protection portion changes from the high conduction state to the low conduction state (e.g., fails, or blows open). In embodiments where the overcurrent protection device is a fuse, the fuse can melt and form an open circuit, e.g., when the fuse changes from the high conduction state to the low conduction state (e.g., fails, or blows open).

Figure 21:
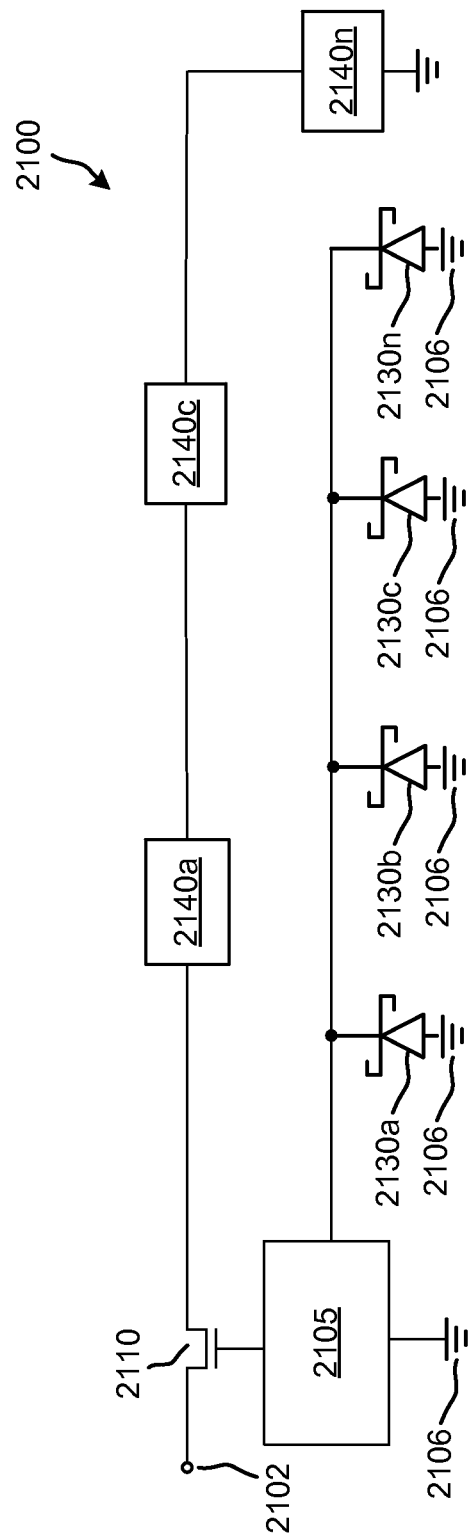
FIG. 21 is a block diagram that illustrates still yet another input power protection device, according to an embodiment.

FIG. 21 is a schematic that illustrates a protection circuit 2100 that may be used to implement an input power protection device (circuit), according to an embodiment. The protection 2100 illustrated in FIG. 21 is implemented using multiple thermal shunts coupled in parallel to ground, according to an embodiment. As shown in FIG. 21, the circuit 2100 includes an input terminal 2102, a ground terminal 2106, a current switch 2110, a sensor 2105, a plurality of thermal shunts (implemented using p-type Schottky diodes 2130a-2130n) and circuit loads 2140a-2140n. The circuit loads 2140a-2140n, depending on the particular implementation, may be configured in series or in parallel with one another, or as a combination of parallel and series loads.

In such an approach, the p-type Schottky diodes 2130a-2130n may be physically dispersed across a circuit board, such as in the fashion described above with respect to FIG. 19. In other embodiments, the p-type Schottky diodes 2130a-2130n may be physically dispersed across an integrated circuit or other device. In such arrangements, each of the p-type Schottky diodes (thermal shunts) 2130a-2130n may be used to detect localized unsafe temperature conditions, such as associated with corresponding circuit loads and/or ambient heat sources, such as within a computing (or electronic) device in which the circuit 2100 is implemented.

In the circuit 2100, the sensor 2105 may be configured to detect, using an internal or external pull-up device (e.g., resistor) at an input terminal, if any of the thermal shunts (p-type Schottky diodes 2130a-2130n) enters a thermally-conductive state. If one more of the p-type Schottky diodes 2130a-2130n were to enter a thermally-induced conductive state (e.g., initiate self-induced thermal runaway as a result of a localized unsafe temperature condition (e.g., above a threshold temperature)), that p-type Schottky diode (or p-type Schottky diodes) would couple the input terminal of the sensor 2105 to ground through its pull-up device. The sensor 2105 may then be configured to open the current switch 2110 (a turn off a transistor), and thus prevent current flow to the circuit loads 2140a-2140n. Stopping current flow to the circuit loads 2140a-2140n in this situation may prevent damage (e.g., any further damage) from the detected unsafe temperature condition(s), e.g., such as a printed circuit board fire and/or damage (or further damage) to one or more of the circuit loads or other components within an electronic device in which the circuit 2100 is implemented.

Implementations of the various techniques described herein may be implemented in digital electronic circuitry, or in computer hardware, firmware, software, or in combinations of them. Portions of methods also may be performed by, and an apparatus may be implemented as, special purpose logic circuitry, e.g., an FPGA (field programmable gate array) or an ASIC (application-specific integrated circuit).

Implementations may be implemented in a computing system that includes a back-end component, e.g., as a data server, or that includes a middleware component, e.g., an application server, or that includes a front-end component, e.g., a client computer having a graphical user interface or a Web browser through which a user can interact with an implementation, or any combination of such back-end, middleware, or front-end components. Components may be interconnected by any form or medium of digital data communication, e.g., a communication network. Examples of communication networks include a local area network (LAN) and a wide area network (WAN), e.g., the Internet.

Some implementations may be implemented using various semiconductor processing and/or packaging techniques. Some embodiments may be implemented using various types of semiconductor processing techniques associated with semiconductor substrates including, but not limited to, for example, Silicon (Si), Galium Arsenide (GaAs), Silicon Carbide (SiC), and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments. It should be understood that they have been presented by way of example only, not limitation, and various changes in form and details may be made. Any portion of the apparatus and/or methods described herein may be combined in any combination, except mutually exclusive combinations. The embodiments described herein can include various combinations and/or sub-combinations of the functions, components and/or features of the different embodiments described.

What is claimed is:

1. An apparatus, comprising:
an input terminal;
an output terminal;
a ground terminal;
an overcurrent protection device coupled between the input terminal and the output terminal; and
a thermal shunt coupled between the output terminal and the ground terminal, the thermal shunt including:
a shunt device; and
a thermally-activated current sink coupled in parallel with the shunt device, the thermally activated current sink being thermally coupled with the overcurrent protection device in a positive thermal-feedback loop,
the thermal shunt being configured to, at a threshold temperature and in response to thermal feedback in the positive thermal-feedback loop, operate in a thermally-induced low-impedance state.

2. The apparatus of claim 1, wherein the overcurrent protection device is configured to change from a high conduction state to a low conduction state as a result of the thermal shunt operating in the thermally-induced low-impedance state.

3. The apparatus of claim 1, wherein the thermally-activated current sink includes a p-type Schottky diode.

4. The apparatus of claim 1, wherein the thermally-activated current sink includes an n-type Schottky diode.

5. The apparatus of claim 1, wherein the overcurrent protection device includes a fuse device configured to blow open as a result of the thermal shunt operating in the thermally-induced low-impedance state.

6. The apparatus of claim 1, wherein the overcurrent protection device is configured to change from a high conduction state to a low conduction state as a result of at least one of:
heat generated by the thermal shunt; and
current pulled through the overcurrent protection device as a result of the thermal shunt operating in the thermally-induced low-impedance state.

7. The apparatus of claim 1, wherein the thermal shunt is configured to operate in the thermally-induced low-impedance state in response to heat that is generated as a result of power dissipated in the overcurrent protection device.

8. The apparatus of claim 1, wherein the thermal shunt is configured to operate in the thermally-induced low-impedance state in response to heat transferred from a printed circuit board on which the apparatus is included.

9. The apparatus of claim 1, further comprising a plurality of thermal shunts coupled in parallel with one another, each of the plurality of thermal shunts being coupled between the output terminal and the ground terminal, the plurality of thermal shunts being spatially distributed across a printed circuit board.

10. The apparatus of claim 1, wherein the overcurrent protection device and the thermally-activated current sink are implemented in a common silicon substrate.

11. An apparatus, comprising:
an input terminal;
an output terminal;
a ground terminal;
an overvoltage protection device coupled between the output terminal and the ground terminal; and
a thermally-activated current sink coupled between the output terminal and the ground terminal, in parallel with the overvoltage protection device; and
an overcurrent protection device coupled between the input terminal and the output terminal, the overcurrent protection device being thermally coupled with the thermally-activated current sink in a positive thermal-feedback loop, such that heat produced by the overcurrent protection device at a current below a rated current of the overcurrent protection device causes at least one of the overvoltage protection device and the thermally-activated current sink to change from a high impedance state to a low impedance state as a result of positive thermal feedback in the positive thermal-feedback loop.

12. The apparatus of claim 11, wherein the thermally-activated current sink changing to the low impedance state occurs as a result of positive thermal feedback between the overcurrent protection device, the overvoltage protection device and the thermally-activated current sink.

13. The apparatus of claim 11, wherein the overvoltage protection device changing to the low impedance state occurs as a result of positive thermal feedback between the overcurrent protection device, the thermally-activated current sink and the overvoltage protection device.

14. The apparatus of claim 11, wherein the thermally-activated current sink includes a cobalt-silicide (CoSi) p-type Schottky diode.

15. The apparatus of claim 11, wherein the thermally-activated current sink includes one of an n-type Schottky diode, a polysilicon resistor with a negative thermal coefficient and a polysilicon diode.

16. The apparatus of claim 11, wherein the thermally-activated current sink, the overvoltage protection device and the overcurrent protection device are implemented in a common silicon substrate such that a positive thermal feedback loop is formed between the overcurrent protection device, the thermally-activated current sink and the overvoltage protection device.

17. The apparatus of claim 11, wherein the overcurrent protection device is configured to change from a high conduction state to a low conduction state as a result of the thermally-activated current sink or the overvoltage protection device changing to the low impedance state.

18. The apparatus of claim 11, wherein the overvoltage protection device includes a Zener diode or a transient-voltage-suppression diode.

19. The apparatus of claim 11, wherein the thermally-activated current sink changing to the low impedance state occurs as a result of a thermal shunt device included in the thermally-activated current sink initiating thermal runaway.

20. The apparatus of claim 11, wherein the overcurrent protection device comprises a fuse configured to blow open as a result of the thermally-activated current sink or the overvoltage protection device changing to the low impedance state.

21. An apparatus, comprising:
an overvoltage protection portion, the overvoltage protection portion including:
a thermally-activated current sink; and
a shunt device coupled in parallel with the thermally activate current sink; and
an overcurrent protection portion thermally coupled with the thermally activated current sink in a positive thermal-feedback loop such that:
positive thermal feedback between the overcurrent protection portion and the thermally activated current sink in the positive thermal-feedback loop causes the overvoltage protection portion to change from a voltage regulation state to a thermally-induced conduction state, and
the overvoltage protection portion changing from the voltage regulation state to the thermally-induced conduction state causes the overcurrent protection portion to change from a current conduction state to a current blocking state.

22. The apparatus of claim 21, wherein the thermally-induced conduction state is a thermal thermal-runaway state.

23. The apparatus of claim 21, wherein the thermally-activated current sink includes a p-type Schottky diode.

24. The apparatus of claim 21, wherein the overcurrent protection portion further includes:
a sensor operably coupled with the overvoltage portion, the sensor being configured to detect the overvoltage protection portion changing from the voltage regulation state to the thermally-induced conduction state; and
a current switch operably coupled with the sensor, the current switch being configured to change from the current conduction state to the current blocking state in response to the sensor detecting the overvoltage protection portion changing from the voltage regulation state to the thermally-induced conduction state.

* * * * *

UNITED STATES PATENT AND TRADEMARK OFFICE
CERTIFICATE OF CORRECTION

| | |
|---|---|
| PATENT NO. | : 9,112,346 B2 |
| APPLICATION NO. | : 13/830964 |
| DATED | : August 18, 2015 |
| INVENTOR(S) | : Christopher Nassar et al. |

It is certified that error appears in the above-identified patent and that said Letters Patent is hereby corrected as shown below:

On the title page, item (56), in column 2, References Cited under "Other Publications", line 1, delete "Littlefuse Indistries," and insert -- Littelfuse Industries, --, therefor.

In the claims

In column 33, lines 54-55, in claim 11, delete "over current" and insert -- overcurrent --, therefor.

In column 34, line 40, in claim 21, delete "thermally activate" and insert -- thermally-activated --, therefor.

In column 34, line 45, in claim 21, delete "thermally activated" and insert -- thermally-activated --, therefor.

In column 34, line 55, in claim 22, delete "thermal thermal-runaway" and insert -- thermal runaway --, therefor.

Signed and Sealed this
Twelfth Day of January, 2016

Michelle K. Lee
*Director of the United States Patent and Trademark Office*